(12) United States Patent
Yamazaki et al.

(10) Patent No.: US 9,306,129 B2
(45) Date of Patent: Apr. 5, 2016

(54) LIGHT-EMITTING ELEMENT UNIT AND DISPLAY DEVICE

(75) Inventors: Shunpei Yamazaki, Tokyo (JP); Yoshiharu Hirakata, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 193 days.

(21) Appl. No.: 13/277,417

(22) Filed: Oct. 20, 2011

(65) Prior Publication Data

US 2012/0099048 A1 Apr. 26, 2012

(30) Foreign Application Priority Data

Oct. 25, 2010 (JP) ................................. 2010-238723

(51) Int. Cl.
| | | |
|---|---|---|
| G02F 1/1335 | (2006.01) | |
| H01L 33/50 | (2010.01) | |
| H01L 33/46 | (2010.01) | |
| H01L 33/48 | (2010.01) | |

(52) U.S. Cl.
CPC ............... *H01L 33/50* (2013.01); *H01L 33/465* (2013.01); *G02F 1/133514* (2013.01); *G02F 1/133621* (2013.01); *H01L 33/486* (2013.01); *H01L 2224/48227* (2013.01); *H01L 2224/48465* (2013.01); *H01L 2924/07811* (2013.01); *H01L 2924/1461* (2013.01); *H01L 2924/3025* (2013.01)

(58) Field of Classification Search
None
See application file for complete search history.

(56) References Cited

U.S. PATENT DOCUMENTS

| | | |
|---|---|---|
| 6,037,719 A | 3/2000 | Yap et al. |
| 6,392,618 B1 | 5/2002 | Kimura |
| 6,421,160 B2 | 7/2002 | Ham |

(Continued)

FOREIGN PATENT DOCUMENTS

| | | |
|---|---|---|
| EP | 2392963 A | 12/2011 |
| JP | 60-247622 | 12/1985 |

(Continued)

OTHER PUBLICATIONS

Gandhi.J et al., "37.4: High Image Quality of Ultra-Low Power Digital Micro-Shutter Based Display Technology", SID Digest '09: SID International Symposium Digest of Technical Papers, May 31, 2009, pp. 532-535.

(Continued)

*Primary Examiner* — Richard Kim
(74) *Attorney, Agent, or Firm* — Nixon Peabody LLP; Jeffrey L. Costellia

(57) ABSTRACT

A light-emitting element unit which can improve color purity of light emitted from a color filter is provided. A display device with high color purity and high color reproducibility is provided. The light-emitting element unit includes a wiring board, a light-emitting element chip provided over the wiring board, a micro optical resonator provided over the wiring board and at the periphery of the light-emitting element chip, and a phosphor layer covering the light-emitting element chip and the micro optical resonator. The display device includes a display panel having a coloring layer and a backlight module having the light-emitting element unit. Examples of the display panel include: a liquid crystal panel; and a display panel including an opening portion provided over a first substrate, MEMS moving over the opening portion in the lateral direction, and a second substrate provided with a coloring layer in a portion corresponding to the opening portion.

23 Claims, 15 Drawing Sheets

(56) References Cited

U.S. PATENT DOCUMENTS

| | | |
|---|---|---|
| 6,583,915 B1 | 6/2003 | Hong et al. |
| 6,972,777 B2 | 12/2005 | Shigeta |
| 7,251,410 B2 | 7/2007 | Ide |
| 7,271,945 B2 | 9/2007 | Hagood et al. |
| 7,416,977 B2 | 8/2008 | Fukuchi et al. |
| 7,800,287 B2 * | 9/2010 | Zheng et al. ............ 313/112 |
| 7,808,009 B2 | 10/2010 | Hirakata et al. |
| 7,985,677 B2 | 7/2011 | Fujii et al. |
| 8,493,304 B2 | 7/2013 | Yamashita et al. |
| 2001/0028430 A1 | 10/2001 | Koma |
| 2003/0209714 A1 * | 11/2003 | Taskar et al. ............ 257/79 |
| 2003/0227361 A1 | 12/2003 | Dickens et al. |
| 2004/0031670 A1 | 2/2004 | Wong |
| 2004/0140872 A1 | 7/2004 | Wong |
| 2004/0169786 A1 | 9/2004 | Yamazaki et al. |
| 2007/0093045 A1 | 4/2007 | Yamaguchi et al. |
| 2007/0218630 A1 | 9/2007 | Yamaguchi et al. |
| 2007/0228390 A1 | 10/2007 | Hattori et al. |
| 2007/0236626 A1 | 10/2007 | Koganezawa |
| 2007/0279727 A1 | 12/2007 | Gandhi et al. |
| 2008/0176046 A1 | 7/2008 | Yamaguchi et al. |
| 2008/0237005 A1 | 10/2008 | Honda |
| 2009/0185584 A1 | 7/2009 | Nomura et al. |
| 2009/0201450 A1 | 8/2009 | Hatano et al. |
| 2011/0032450 A1 | 2/2011 | Shigeta et al. |
| 2011/0051043 A1 | 3/2011 | Kim et al. |
| 2011/0058120 A1 | 3/2011 | Oohira |
| 2011/0114969 A1 * | 5/2011 | Lee et al. ............ 257/88 |

FOREIGN PATENT DOCUMENTS

| | | |
|---|---|---|
| JP | 08-262438 A | 10/1996 |
| JP | 09-092909 | 4/1997 |
| JP | 11-174994 | 7/1999 |
| JP | 2000-208018 | 7/2000 |
| JP | 2001-033827 | 2/2001 |
| JP | 2003-203549 | 7/2003 |
| JP | 2003-217423 | 7/2003 |
| JP | 2004-240412 | 8/2004 |
| JP | 2004-295141 | 10/2004 |
| JP | 3590283 | 11/2004 |
| JP | 2005-528751 | 9/2005 |
| JP | 2005-311153 A | 11/2005 |
| JP | 2006-351808 A | 12/2006 |
| JP | 3865942 | 1/2007 |
| WO | WO-2006/091738 | 8/2006 |
| WO | WO-2010/087049 | 8/2010 |

OTHER PUBLICATIONS

Gandhi.J et al., "56.1: Sunlight Readability of Digital Micro Shutter Based Display Technology", SID Digest '10: SID International Symposium Digest of Technical Papers, 2010, pp. 834-837.

* cited by examiner

LIGHT-EMITTING ELEMENT UNIT AND DISPLAY DEVICE

BACKGROUND OF THE INVENTION

1. Field of the Invention

The present invention relates to a light-emitting element unit, a backlight including a plurality of the light-emitting element units, and a display device including the backlight.

2. Description of the Related Art

As a backlight of a liquid crystal display device, a cold cathode fluorescent lamp has been used. However, in recent years, a light-emitting diode (LED) unit with less power consumption has come into use instead of the cold cathode fluorescent lamp, because the cold cathode fluorescent lamp requires more power consumption in comparison to the light-emitting diode (see Patent Document 1).

The light-emitting diode which has been recently used has a structure in which a phosphor is provided over an LED chip emitting blue light, the phosphor is excited by the blue light to provide yellow light, and then white light is emitted by mixing the yellow light and the blue light.

Further, there is a backlight which emits white light by mixing light emitted from a red-light-emitting diode, light emitted from a blue-light-emitting diode, and light emitted from a green-light-emitting diode.

REFERENCE

[Patent Document 1] Japanese Published Patent Application No. 2004-240412

SUMMARY OF THE INVENTION

An emission spectrum of light from the light-emitting diode in which a phosphor is provided over an LED chip emitting blue light has high emission intensity at a wavelength of 450 nm exhibiting blue and has a peak at a wavelength of 550 nm exhibiting green. However, the intensity of the peak at the wavelength of 550 nm exhibiting green is lower than that of the peak at the wavelength of 450 nm exhibiting blue. In addition, at a wavelength of 700 nm exhibiting red, there is no peak and the intensity is low.

Thus, when white light emitted from the light-emitting diode in which a phosphor is provided over an LED chip emitting blue light is transmitted through a color filter, the light transmitted through the color filter has low color purity of green light and red light. Therefore, color purity of light emitted from a display device is reduced, which causes a problem of low color reproducibility.

In the case where white light is emitted by using a red-light-emitting diode, a blue-light-emitting diode, and a green-light-emitting diode as backlights, the number of components is increased, and it is a factor contributing to increase in cost.

Thus, an object of one embodiment of the present invention is to provide a light-emitting element unit which enables increase in color purity of light emitted through a color filter, and a backlight in which the light-emitting element unit is incorporated. Further, an object of one embodiment of the present invention is to provide a display device with high color purity and high color reproducibility.

One embodiment of the present invention is a light-emitting element unit including a wiring board, a light-emitting element chip provided over the wiring board, a micro optical resonator provided over the wiring board and at the periphery of the light-emitting element chip, and a phosphor layer covering the light-emitting element chip and the micro optical resonator. Note that in the light-emitting element unit, an organic resin layer which has a convex shape and a light-transmitting property (hereinafter referred to as a light-transmitting convex organic resin layer) may be provided to cover the phosphor layer.

The micro optical resonator includes, over a substrate, a reflective layer, a layer having semi-transmissive and semi-reflective properties (hereinafter referred to as a semi-transmissive reflective layer), and a light-transmitting layer provided between the reflective layer and the semi-transmissive semi-reflective layer. The reflective layer and the semi-transmissive semi-reflective layer are provided at a distance from one another so that light at a predetermined wavelength is reflected and interferes between the two layers to increase the peak intensity. That is, light emitted from the light-emitting element chip is reflected at the phosphor layer to become white light, and then the white light is reflected and interferes in the micro optical resonator, and thereby is emitted as light at a predetermined wavelength. Thus, the light-emitting element unit according to one embodiment of the present invention can emit white light with increased peak intensity at a predetermined wavelength. When the white light passes through a coloring layer of a color to which the above peak corresponds, light of a color with high color purity is produced.

Further, another embodiment of the present invention is a display device which includes a display panel having a coloring layer, and the above-described light-emitting element unit provided in a backlight module. Examples of the display panel having a coloring layer includes: a liquid crystal panel; and a display panel which includes an opening portion provided over a first substrate, MEMS moving over the opening portion in the lateral direction, and a second substrate provided with a coloring layer in a portion corresponding to the opening portion.

The backlight module including the light-emitting element unit emits white light having a peak of a wavelength corresponding to a color of the coloring layer; thus, light transmitted through the coloring layer in the display panel has high color purity. Therefore, the color reproducibility of the display device can be improved.

According to one embodiment of the present invention, a micro optical resonator is provided at the periphery of an LED chip, whereby a light-emitting element unit which enables an increase in color purity of light transmitted through a color filter, and a backlight can be provided. Furthermore, according to one embodiment of the present invention, a display device with high color purity and high color reproducibility can be provided.

DETAILED DESCRIPTION OF THE INVENTION

Figure 1A:
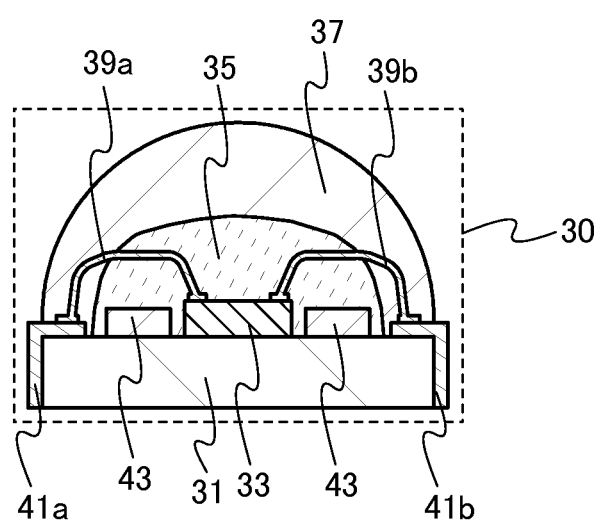
FIGS. 1A and 1B are a cross-sectional view and a top view illustrating a light-emitting element unit according to the present invention.

Hereinafter, embodiments of the present invention will be described with reference to drawings. However, the present invention is not limited to the following description. It is easily understood by those skilled in the art that the mode and detail can be variously changed unless departing from the scope and spirit of the present invention. Therefore, the present invention should not be interpreted as being limited to the description of the embodiments to be given below. Note that reference numerals denoting the same portions are commonly used in different drawings.

Embodiment 1

In this embodiment, an LED unit and a backlight which consume less power will be described with reference to FIGS. 1A and 1B and FIGS. 2A-1, 2A-2, 2B, and 2C.

FIG. 1A is a cross-sectional view of an LED unit 30.

The LED unit 30 includes a light-emitting element chip (hereinafter, referred to as an LED chip 33) provided over a wiring board 31, a phosphor layer 35 provided over the LED chip 33, and a light-transmitting convex organic resin layer 37 provided to cover the wiring board 31 and the phosphor layer 35. An electrode of the LED chip 33 is electrically connected to terminals 41a and 41b provided on side walls of the wiring board 31 through wirings 39a and 39b.

Figure 1B:
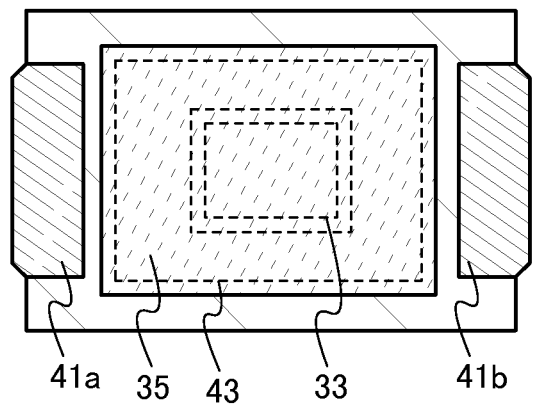

FIG. 1B is a top view of the LED chip 33 illustrated in FIG. 1A from which the light-transmitting convex organic resin layer 37 is excluded. As illustrated in FIG. 1B, there is a feature in that a micro optical resonator 43 is provided around the LED chip 33. The micro optical resonator 43 is an element which can make white light change into colored light at a predetermined wavelength.

For the wiring board 31, a glass epoxy resin substrate, a polyimide substrate, a ceramic substrate, an alumina substrate, an aluminum nitride substrate, or the like is used.

For the LED chip 33, a light-emitting diode which can emit blue light is used. As the typical light-emitting diode which can emit blue light, a diode formed using a nitride(Group III)-based compound semiconductor is used, and examples thereof include a diode including a GaN-based material which is represented by a formula, $In_xAl_yGa_{1-x-y}N$ (x is greater than or equal to 0 and less than or equal to 1, y is greater than or equal to 0 and less than or equal to 1, and "x+y" is greater than or equal to 0 and less than or equal to 1).

Typical examples of the phosphor layer 35 include an organic resin layer having a surface on which a phosphor is printed, an organic resin layer whose surface is coated with a phosphor, and an organic resin layer mixed with a phosphor. As a typical example of a yellow phosphor, YAG (yttrium aluminum garnet)-based phosphor, a silicate-based phosphor, or the like can be given.

Note that an example in which an LED chip which can emit blue light is used as the LED chip 33 and a phosphor layer including a phosphor of yellow which is a complementary color of blue is used as the phosphor layer 35 is described here. Alternatively, an LED chip which can emit green light may be used as the LED chip 33, and a phosphor layer including a phosphor of a complementary color of green (red or magenta) may be used as the phosphor layer 35.

Note that blue light has a maximum peak at a wavelength range of 430 to 490 nm in an emission spectrum. Green light has a maximum peak at a wavelength range of 490 to 550 nm in the emission spectrum. Yellow light has a maximum peak at a wavelength range of 550 to 590 nm in the emission spectrum. Red light has a maximum peak at a wavelength range of 640 to 770 nm in the emission spectrum.

The light-transmitting convex organic resin layer 37 is formed using a light-transmitting organic resin. There is no particular limitation on the kind of organic resin, and typically, an ultraviolet curable resin such as an epoxy resin or a silicone resin, a visible light curable resin, or the like can be used as appropriate. The above light-transmitting organic resin is formed to have a predetermined height, a predetermined width, and a predetermined curvature radius so that light with a desired shape can be emitted. The above light-transmitting organic resin may be formed by a droplet discharge method, a coating method, an imprinting method, or the like. Alternatively, an organic resin may be shaped to be convexed in advance, and may be compressed while being heated. The light-transmitting convex organic resin layer 37 has a function of diffusing light emitted from the LED chip 33.

An end portion of the phosphor layer 35 is positioned on an outer side of an end portion of the micro optical resonator 43 and the phosphor layer 35 covers the whole of the micro optical resonator 43, whereby light which is fully reflected between a reflective electrode and a semi-transmissive semi-reflective electrode in the micro optical resonator 43 is reflected or refracted at an interface between the phosphor layer 35 and the light-transmitting convex organic resin layer 37. Thus, light incident on the micro optical resonator 43 can be utilized efficiently.

The wirings 39a and 39b are thin wires formed using gold, an alloy including gold, copper, or an alloy including copper.

The terminals 41a and 41b are conductive layers connected to the electrode of the LED chip 33, which are formed using one element selected from nickel, copper, silver, platinum, or gold or an alloy material including any of the elements at 50% or more. The terminals 41a and 41b and the electrode of the LED chip 33 are connected by a wire bonding method using a thermo-compression bonding method or an ultrasonic bonding method.

The micro optical resonator 43 is described below with reference to FIGS. 2A-1, 2A-2, 2B, and 2C.

Figures 1, 2A:
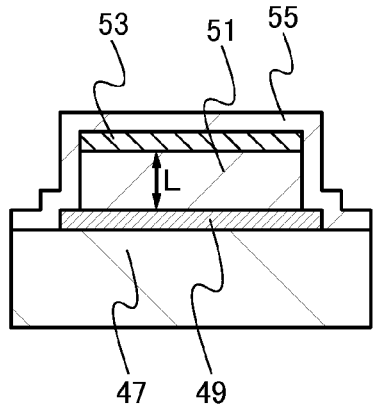
FIGS. 2A-1, 2A-2, 2B, and 2C illustrate a light-emitting element unit according to the present invention.
Figures 2, 2A:
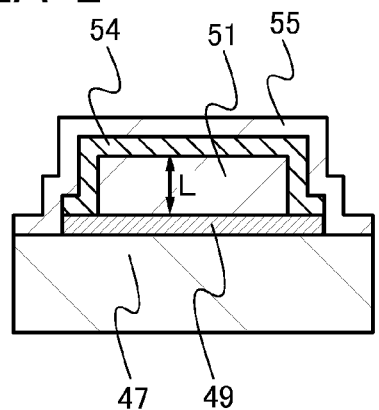

FIGS. 2A-1 and 2A-2 are enlarged cross-sectional views of the micro optical resonator 43.

As illustrated in FIG. 2A-1, the micro optical resonator 43 includes a reflective layer 49 provided over a substrate 47, a light-transmitting layer 51 provided over the reflective layer 49, and a semi-transmissive semi-reflective layer 53 provided over the light-transmitting layer 51. Further, a protective layer 55 may be provided over the reflective layer 49, the light-transmitting layer 51, and a surface of the semi-transmissive semi-reflective layer 53.

Alternatively, as illustrated in FIG. 2A-2, the micro optical resonator 43 may include the reflective layer 49 provided over the substrate 47, the light-transmitting layer 51 provided over the reflective layer 49, and a semi-transmissive semi-reflective layer 54 provided over the reflective layer 49 and the light-transmitting layer 51. The semi-transmissive semi-reflective layer 54 is provided on side walls of the light-transmitting layer 51 as illustrated in FIG. 2A-2, whereby light which is fully reflected on an upper side and a lower side of the light-transmitting layer 51 is also fully reflected on the side walls of the light-transmitting layer 51. Thus, light entering the micro optical resonator 43 can be utilized efficiently.

The reflective layer 49 is formed using a metal material with high reflectivity. The reflectivity of the reflective layer 49 is 50% or higher, preferably 80% or higher. As the metal material with high reflectivity, aluminum, silver, molybdenum, tungsten, nickel, chromium, an alloy of any of these elements, an AgPdCu alloy, or the like can be given. Further, the reflective layer 49 may have a dielectric multilayer structure in which two kinds of transmissive insulating layers with different refractive indices are alternately stacked. Here, as the refractive indices of the two kinds of transmissive insulating layers are high, or as the number of the layers is large, the reflection efficiency is high. For example, as a stacked structure of a dielectric multilayer structure, a stacked structure of titanium dioxide and silicon dioxide, a stacked structure of zinc sulfide and magnesium fluoride, a stacked structure of amorphous silicon and silicon nitride, or the like can be employed.

The reflective layer 49 can be formed by a sputtering method, an evaporation method, or the like.

The semi-transmissive semi-reflective layer 53 has reflectivity which is higher than or equal to 30% and lower than or equal to 70%, preferably higher than or equal to 40% and lower than or equal to 60%. The semi-transmissive semi-reflective layer 53 can be formed using silver, aluminum, an aluminum alloy, a magnesium-silver alloy, or the like. In order to achieve the above reflectivity, the thickness of the semi-transmissive semi-reflective layer 53 is greater than or equal to 5 nm and less than or equal to 20 nm, preferably greater than or equal to 7 nm and less than or equal to 15 nm.

The semi-transmissive semi-reflective layer 53 can be formed by a sputtering method, an evaporation method, or the like.

As the light-transmitting layer 51, a light-transmitting insulating layer or a light-transmitting conductive layer can be used. Typical examples of the light-transmitting insulating layer include silicon oxide, silicon oxynitride, alumina, aluminum nitride, and an epoxy resin. Typical examples of the light-transmitting conductive layer include indium oxide including tungsten oxide, indium zinc oxide including tungsten oxide, indium oxide including titanium oxide, indium tin oxide including titanium oxide, indium tin oxide, indium zinc oxide, and indium tin oxide to which silicon oxide is added. Note that the light-transmitting layer 51 may have a stacked structure of a plurality of layers.

Figure 2B:
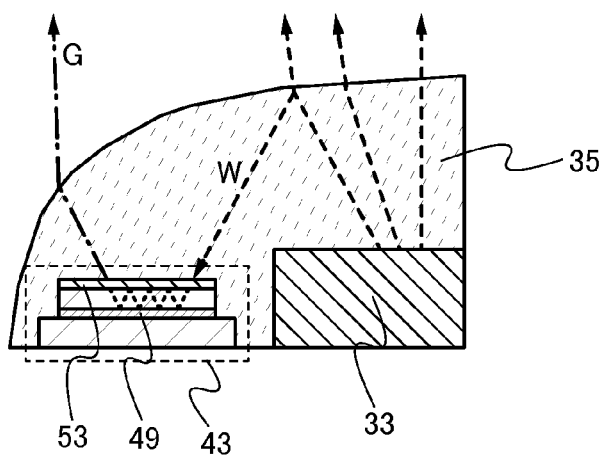

A structure of a light-emitting element unit which can make white light change into colored light at a predetermined wavelength is described below with reference to FIG. 2B. FIG. 2B is an enlarged view of the phosphor layer 35 covering the LED chip 33 and the micro optical resonator 43 of FIG. 1A.

When light is repeatedly reflected between the reflective layer 49 and the semi-transmissive semi-reflective layer 53 and interferes, the intensity of light at a predetermined wavelength is increased, and an emission spectrum having a sharp peak is obtained. Such a structure is called a micro optical resonator structure (a microcavity structure). Light emitted from the LED chip 33 is reflected at a specific position of the phosphor layer 35, an interface between the phosphor layer 35 and the light-transmitting convex organic resin layer 37, an interface between the light-transmitting convex organic resin layer 37 and the air, or the like to be white light W. Then, the white light W enters the micro optical resonator 43. The entering light is reflected and interferes between the reflective layer 49 and the semi-transmissive semi-reflective layer 53, and after that, light G at a predetermined wavelength is emitted from the micro optical resonator 43. Thus, from the LED unit 30, white light having a sharp peak at a predetermined wavelength in an emission spectrum is emitted.

In order to increase the intensity of light at the predetermined wavelength, in the micro optical resonator 43, a light path length L between the reflective layer 49 and the semi-transmissive semi-reflective layer 53 may be determined in accordance with the wavelength. The light path length L in this case is described below.

An interference between light (θ) at a wavelength λ passing from the semi-transmissive semi-reflective layer 53 to the reflective layer 49 and light returned from the reflective layer 49 to the semi-transmissive semi-reflective layer 53 is represented by Formula 1.

$$\sin(\theta)+\sin(\theta+2\pi\times 2nL/\lambda+\pi) \qquad \text{(Formula 1)}$$

By modifying Formula 1, Formula 2 can be obtained.

$$-2\cos(\theta+2\pi nL/\lambda)\times\sin(2\pi nL/\lambda) \qquad \text{(Formula 2)}$$

Formula 2 has the maximum value when the value "sin($2\pi nL/\lambda$)" satisfies Formula 3.

$$2\pi nL/\lambda=\pi(2m+1)/2 \ (m \text{ is an integer}) \qquad \text{(Formula 3)}$$

From the above, when the light path length L between the reflective layer 49 and the semi-transmissive semi-reflective layer 53 is obtained from Formula 4, light whose wavelength λ has the increased intensity can be emitted from the micro optical resonator 43.

$$L=(2m+1)\lambda/4n \qquad \text{(Formula 4)}$$

Note that n represents the refractive index of the light-transmitting layer 51.

Further, in the case where the light-transmitting layer 51 has a stacked structure of a plurality layers (n layers), assuming that the refractive indices of the layers are $n_1, n_2, \ldots n_n$ and the light path lengths of the layers obtained by Formula 4 are $l_1, l_2, \ldots l_n$, the light path length L is the sum of $l_1$ to $l_n$.

Figure 2C:
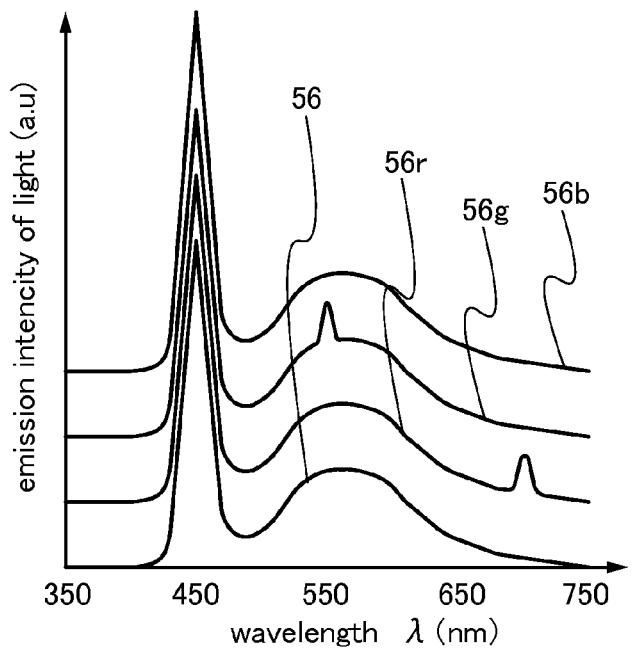

FIG. 2C is a schematic diagram of the emission intensity of light emitted from the LED unit. A curve 56 indicates an emission spectrum of light emitted from an LED unit which does not include the micro optical resonator 43. The curve 56 has a steep peak at a wavelength in the vicinity of 450 nm exhibiting blue, but the spectrum intensity in the vicinity of 550 nm exhibiting green and the spectrum intensity in the vicinity of 700 nm exhibiting red are low. Thus, even when the white light passes through a red coloring layer or a green coloring layer, the color purity is low in either case.

A curve 56r indicates an emission spectrum of light emitted from an LED unit including the micro optical resonator 43 which has the light path length L enhancing the intensity of red light. A curve 56g indicates an emission spectrum of an LED unit including the micro optical resonator 43 which has the light path length L enhancing the intensity of green light. A curve 56b indicates an emission spectrum of an LED unit including the micro optical resonator 43 which has the light path length L enhancing the intensity of blue light.

The curve 56*r* has a steep peak in the vicinity of 700 nm exhibiting red in addition to a peak in the vicinity of 450 nm exhibiting blue.

The curve 56*g* has a steep peak in the vicinity of 550 nm exhibiting green in addition to a peak in the vicinity of 450 nm exhibiting blue.

The curve 56*b* has a higher peak than the curve 56 in the vicinity of 450 nm exhibiting blue.

As described above, a micro optical resonator having a light path length which enhances the intensity of light at the predetermined wavelength is provided in the LED unit 30, whereby the intensity of light at the predetermined wavelength emitted from the LED unit 30 can be increased as compared to that emitted from a conventional LED unit in which the micro optical resonator is not provided. Therefore, when the light passes through a coloring layer which transmits light with the increased intensity of light at the predetermined wavelength, the color purity of the transmitted light is increased as compared to the conventional case. For example, when white light having the high intensity of red light passes through a red coloring layer, the red color purity is increased as compared to the conventional case.

Note that in this embodiment, the LED chip 33 emits blue light. Thus, white light emitted from the LED unit has the sufficiently high peak intensity exhibiting blue, and accordingly, the micro optical resonator which makes the intensity of the light at wavelength exhibiting blue increase is not necessarily provided. Similarly, in the case where the LED chip emits red light or green light, the micro optical resonator which makes the intensity of the light at wavelength exhibiting red or green increase is not necessarily provided.

Next, a backlight module including the LED unit illustrated in FIGS. 1A and 1B and FIGS. 2A-1, 2A-2, 2B, and 2C will be described with reference to FIG. 3, FIG. 4, and FIG. 5.

Figure 3:
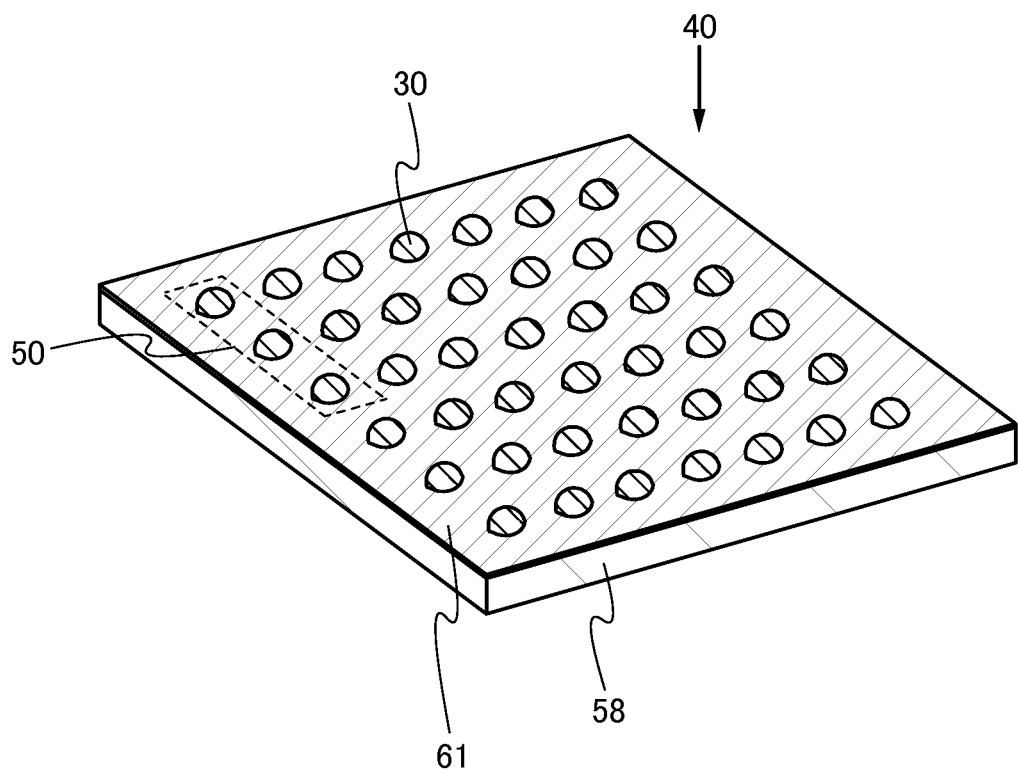
FIG. 3 is a perspective view illustrating a backlight module according to the present invention.
Figure 4:
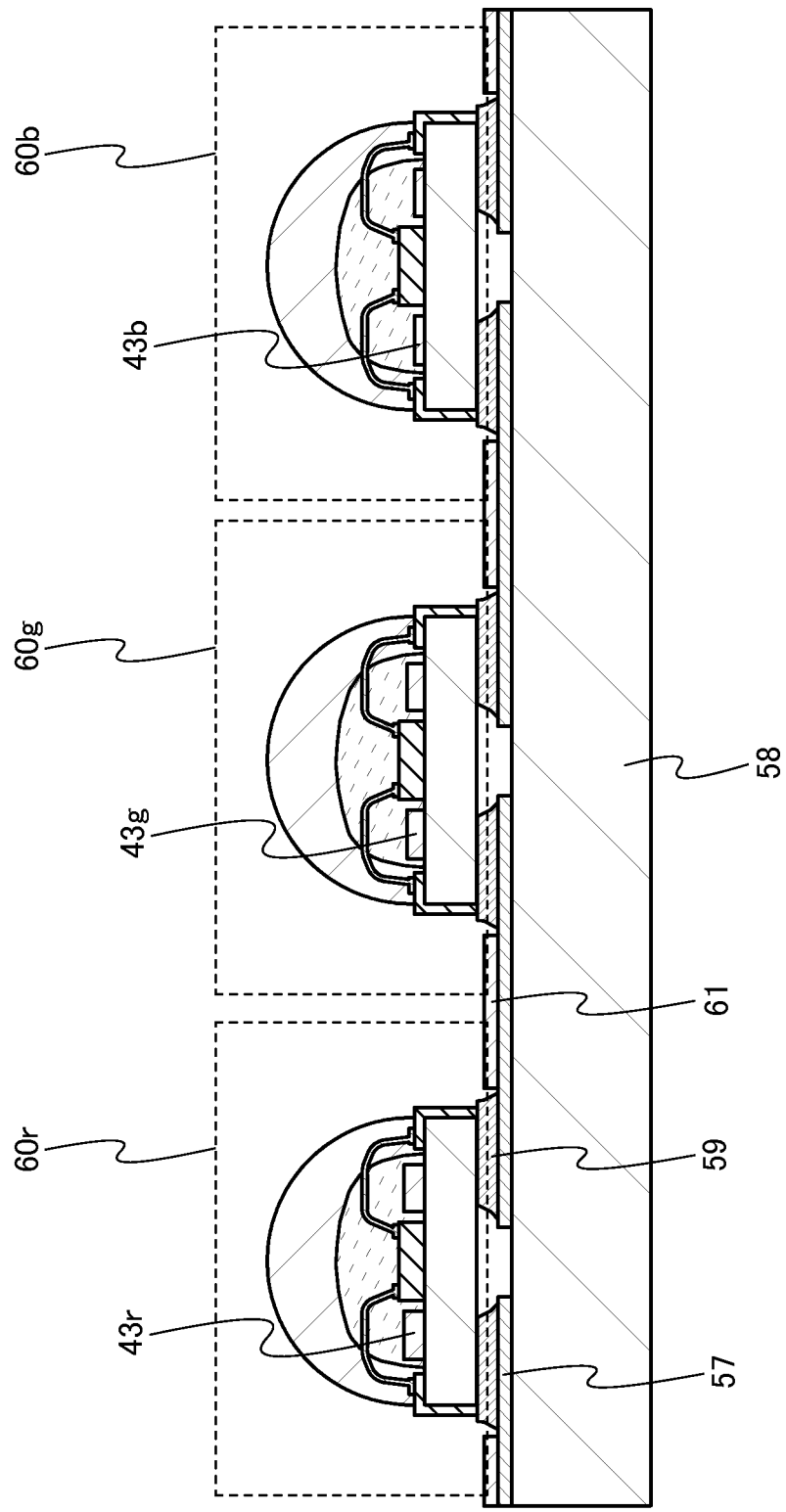
FIG. 4 is a cross-sectional view illustrating a backlight module according to the present invention.

FIG. 3 is a perspective view of a direct-below-type backlight module 40. The LED units 30 are arranged over a substrate 58 so as to be connected in series. A reflective sheet 61 is provided around the LED units 30. Although not illustrated, the LED units 30 are electrically connected to a control circuit board via a connector and a wiring. In this case, the control circuit board is provided on the back side of the backlight module 40.

Next, details of the backlight module are described with reference to FIG. 4. Here, the LED units surrounded by a dashed line 50 in FIG. 3 are used for description.

Over the substrate 58 provided with a wiring 57, an LED unit 60*r* emitting white light having at least a peak of red wavelength, an LED unit 60*g* emitting white light having at least a peak of green wavelength, and an LED unit 60*b* emitting white light having at least a peak of blue wavelength are provided. Each of the LED units 60*r*, 60*g*, and 60*b* is connected to the wiring 57 with a conductive paste 59. The reflective sheet 61 is provided over a portion where the substrate 58 and the wiring 57 are exposed.

There is no particular limitation on a substrate used as the substrate 58 as long as it can withstand heat generation in the manufacturing process or practical use. Typical examples of the substrate 58 includes a glass substrate, a plastic substrate, a glass epoxy resin substrate, a polyimide substrate, a ceramic substrate, an alumina substrate, an aluminum nitride substrate, and a printed board. In the case where a printed board where a wiring is formed in advance by a printing method or the like is prepared for the backlight module 40, the wiring 57 described later need not be formed by an evaporation method, a sputtering method, a droplet discharge method (such as an inkjet method, screen printing, or offset printing), a coating method, or the like; thus, manufacturing with high yield can be conducted. Here, a glass epoxy resin substrate is used as the substrate 58.

The wiring 57 is formed using one element selected from aluminum, nickel, copper, silver, platinum, or gold, or an alloy material including any of the elements at 50% or more. The wiring 57 is formed by an evaporation method, an inkjet method, a printing method, or the like.

The conductive paste 59 is formed using an alloy including plural elements selected from tin, silver, bismuth, copper, indium, nickel, antimony, zinc, and the like.

In this embodiment, the LED units 60*r*, 60*g*, and 60*b* are mounted over the substrate 58 by a reflow process using the conductive paste. Typically, a surface of the wiring 57 formed over the substrate 58 is coated with a conductive paste by screen printing or a dispenser method, and the LED units 60*r*, 60*g*, and 60*b* are mounted thereover with a mounter. Then, the conductive paste is heated at 250° C. to 350° C. to be melted, so that terminals of the LED units 60*r*, 60*g*, and 60*b* and the wiring 57 are electrically and mechanically connected.

Instead of the mounting method by a reflow process using a conductive paste, local pressure bonding may be performed with use of an anisotropic conductive adhesive, so that the LED units 60*r*, 60*g*, and 60*b* may be mounted over the substrate 58.

As the reflective sheet 61, a substrate provided with white pigment which is light reflective coating is used. Typical examples of the reflective sheet 61 include plastic with a surface on which a white coating is printed or applied, and plastic mixed with the white coating. The white coating includes organic pigment or inorganic pigment such as zinc oxide, titanium oxide, calcium carbonate, silicon oxide, or boron nitride. As the plastic, PET, polyester, polyolefin, or the like can be given. Further, foamable PET including a phosphor material can be used. Alternatively, instead of using the reflective sheet 61, the substrate 58 and the wiring 57 may be coated with a white solder resist. With the reflective sheet 61 or the white solder resist, light emitted from the LED chip to the substrate side can be reflected.

As the LED units 60*r*, 60*g*, and 60*b*, LED units which are similar to the LED unit 30 illustrated in FIG. 1A can be used.

The LED units 60*r*, 60*g*, and 60*b* include micro optical resonators 43*r*, 43*g*, and 43*b*, respectively. The micro optical resonators 43*r*, 43*g*, and 43*b* emit light of high intensity with respect to red, light of high intensity with respect to green, and light of high intensity with respect to blue by causing interference of light emitted from the LED chips. Light path lengths of the micro optical resonators 43*r*, 43*g*, and 43*b* are determined so as to increase the intensities of light at wavelengths exhibiting red, green, and blue respectively. This is not limited to these three specific colors, the light path lengths of the micro optical resonators 43*r*, 43*g*, and 43*b* can be determined to increase the intensities of light at any wavelength. Thus, the thicknesses of the micro optical resonators 43*r*, 43*g*, and 43*b* are different from each other.

Figure 5:
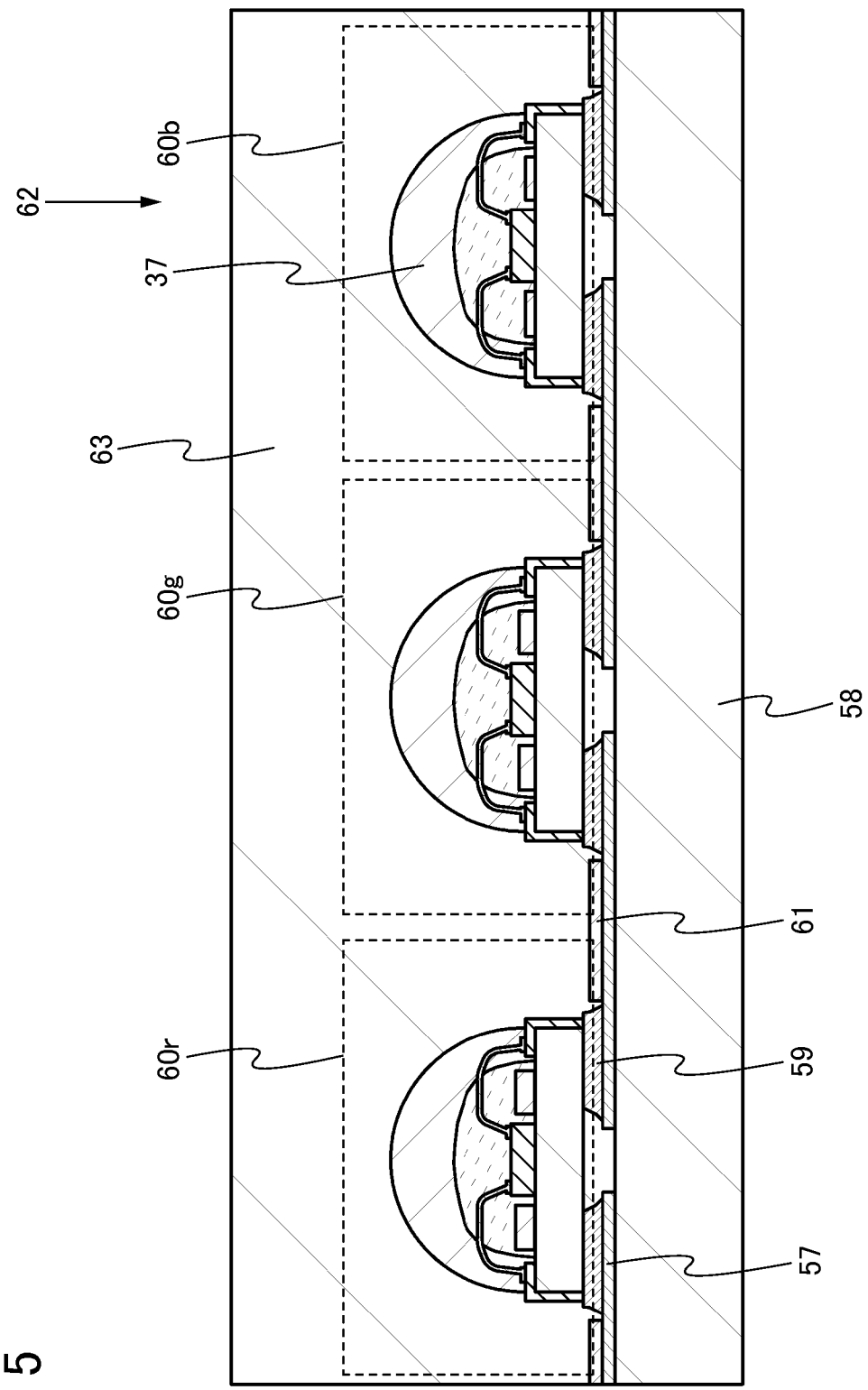
FIG. 5 is a cross-sectional view illustrating a backlight module according to the present invention.

Furthermore, as illustrated in FIG. 5, an organic resin layer 63 having a light-transmitting property (a light-transmitting organic resin layer 63) may be provided over the LED units 60*r*, 60*g*, and 60*b* and the reflective sheet 61. For the organic resin layer 63, any of the organic resin that can be used for the light-transmitting convex organic resin layer 37 can be used as appropriate. Note that the light-transmitting organic resin layer 63 is formed so as not to contain air at an interface between the light-transmitting convex organic resin layer 37 and the light-transmitting organic resin layer 63. Further, it is preferable to select a material so that the light-transmitting organic resin layer 63 can have an optical refractive index which uniforms luminance of light emitted from the light-transmitting convex organic resin layer 37 and which is close to an optical refractive index of the light-transmitting convex organic resin layer 37. The light-transmitting organic resin layer 63 is formed by a droplet discharge method, a coating method, a spin coating method, a dipping method, or the like, or may be formed with a tool such as a doctor knife, a roll coater, a curtain coater, or a knife coater.

With use of the above-described LED unit and backlight module, the color purity of light transmitted through the coloring layer can be increased.

Embodiment 2

In this embodiment, a liquid crystal display device including the backlight module described in Embodiment 1 will be described.

Figure 6A:
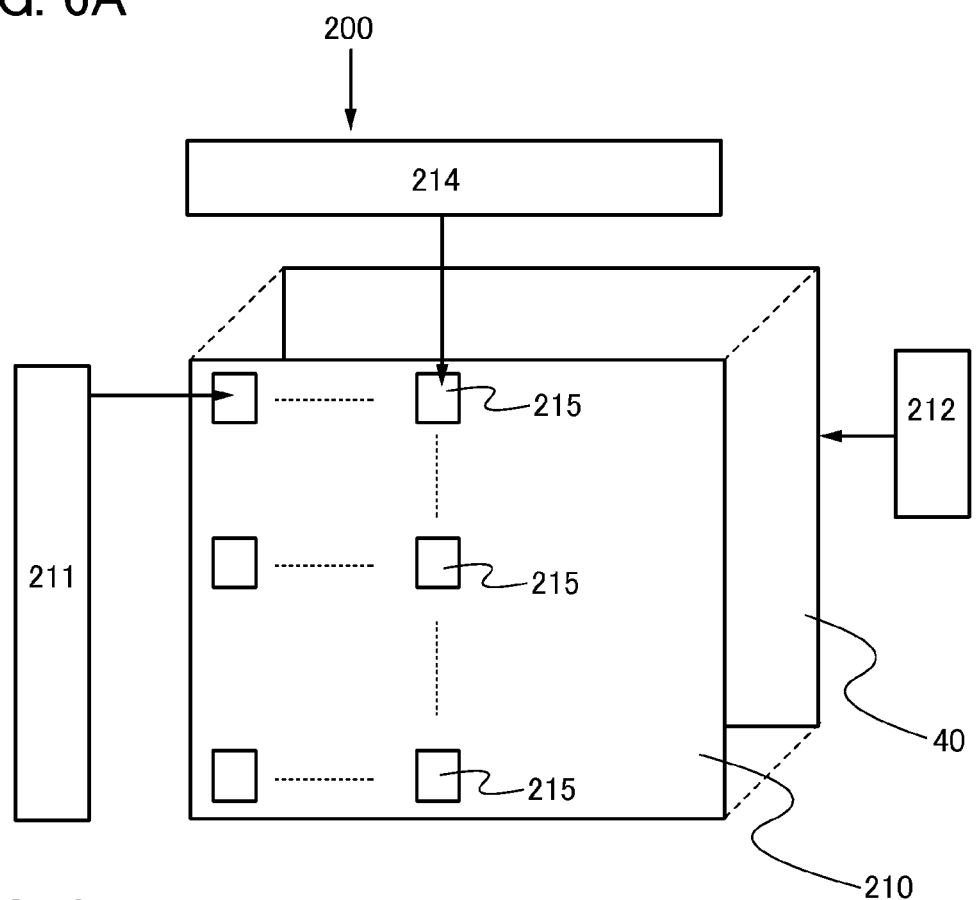
FIGS. 6A and 6B are a block diagram and a circuit diagram illustrating a display device according to the present invention.

The liquid crystal display device in this embodiment can be implemented for both passive matrix type and active matrix type. FIG. 6A is a block diagram illustrating a structure of an active-matrix liquid crystal display device 200.

In FIG. 6A, the liquid crystal display device 200 includes a pixel portion 210 which displays an image, a signal line driver circuit 214, a scan line driver circuit 211, a backlight module 40 which emits light to the pixel portion 210, and an LED control circuit 212 which controls a signal sent to an LED unit included in the backlight module 40. In addition, a circuit which is necessary for operating the liquid crystal display device, such as an image processing circuit (an image engine or the like) is included. All of them are provided for the control circuit board described in Embodiment 1. Note that the driver circuits, the processing circuit, and the image processing circuit are each roughly divided into a logical circuit portion and a switch portion or a buffer portion, and details of the structures of the circuits are omitted. Further, part of or entire of the above circuit may be mounted using a semiconductor device such as an IC.

The pixel portion 210 includes a plurality of pixels 215 provided on a liquid crystal panel. The scan line driver circuit 211 is a circuit which drives the pixels 215 and has a function of outputting a plurality of display selection signals which are pulse signals. The signal line driver circuit 214 has a function of generating a display data signal on the basis of an inputted image signal and outputting the generated display data signal. Further, the outputted display data signal is inputted to the corresponding pixel.

Figure 6B:
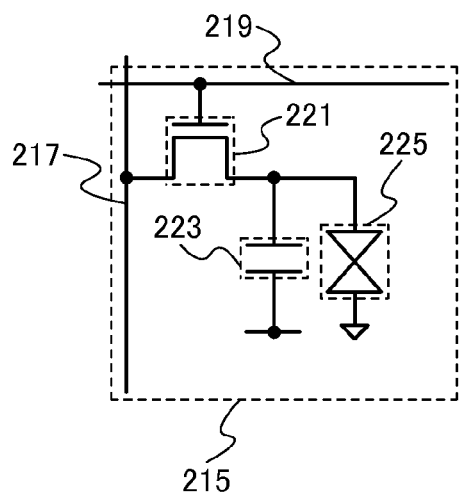

FIG. 6B is a circuit diagram of the pixel 215. In the pixel 215, a transistor (mainly, a thin film transistor: TFT) is provided as a switching element for controlling potential of a pixel electrode. The pixel 215 includes: a thin film transistor 221 in which a gate is electrically connected to a scan line 219 and a first electrode is electrically connected to a signal line 217; a capacitor 223 in which a first electrode is electrically connected to a second electrode of the thin film transistor 221 and a second electrode is electrically connected to a wiring for supplying a fixed potential (also referred to as a capacitor line); and a liquid crystal element 225 in which one of electrodes (also referred to as a pixel electrode) is electrically connected to the second electrode of the thin film transistor 221 and the first electrode of the capacitor 223 and the other electrode (also referred to as a counter electrode) is electrically connected to a wiring for supplying a counter potential.

In this specification, a liquid crystal panel displays an image by controlling light transmission or non-transmission by the optical modulation action of a liquid crystal. The optical modulation action of a liquid crystal is controlled by an electric field applied to the liquid crystal (including a horizontal electric field, a vertical electric field, and an oblique electric field).

Next, an embodiment of the liquid crystal display device 200 is described with reference to a cross-sectional view of the liquid crystal display device 200 illustrated in FIGS. 7A and 7B. The liquid crystal display device illustrated in FIG. 7A includes: the backlight module 40 described in Embodiment 1; a diffusion plate 301 overlapping with the backlight module 40; a first polarizing plate 303 overlapping with the backlight module 40 and the diffusion plate 301; a liquid crystal panel 305 overlapping with the backlight module 40, the diffusion plate 301, and the first polarizing plate 303; and a second polarizing plate 307 overlapping with the backlight module 40, the diffusion plate 301, the first polarizing plate 303, and the liquid crystal panel 305. Note that although not illustrated, a reflective plate may be provided on an outer side of the backlight module 40, so that light leaking through the backlight module 40 is reflected and incident on the liquid crystal panel 305.

A circuit necessary for operating the liquid crystal display device 200 is connected to the liquid crystal panel 305 and the backlight module 40. Note that the scan line driver circuit 211 and the signal line driver circuit 214 may be provided in the liquid crystal panel 305.

Next, details of components included in the liquid crystal display device 200 are described.

As the backlight module 40, the backlight module described in Embodiment 1 is used. The backlight module described in Embodiment 1 includes the micro optical resonator having a light path length which enhances the intensity of light at the predetermined wavelength; thus, light emitted from the LED unit can have higher intensity of light at the predetermined wavelength than white light emitted from the conventional LED unit. Therefore, when the light passes through a coloring layer which transmits a color of high intensity at the predetermined wavelength, the color purity of the transmitted light is increased more than the convention case. As a result, color reproducibly of the display device in this embodiment can be increased.

There is no particular limitation on the first polarizing plate 303 which polarizes light emitted from the diffusion plate 301 as long as it can make the light emitted from the diffusion plate 301 polarize. A commercial product may be used, and one which is conventionally used can be employed. For example, a polarizing plate including a high molecule such as polyvinyl alcohol can be used. The first polarizing plate 303 may have a plate shape or a sheet shape (a film shape). In addition, it is preferable to use a polarizing plate which has the optical refractive index as equivalent as possible to that of another component included in the liquid crystal display device 200.

The liquid crystal panel 305 includes a layer including a switching element (hereinafter, referred to as an element layer 317) over a substrate 315, a pixel electrode 319 formed over the element layer 317, a counter substrate 321 provided with a light-blocking layer 335, a coloring layer 337, a protective layer 339, and a common electrode 323, a sealant 325, and a liquid crystal 327 which transmits or blocks incident light. Although not illustrated in FIGS. 7A and 7B, a spacer is provided so that a distance (a cell gap) between the pixel electrode 319 and the common electrode 323 is controlled to be constant. As the spacer, a bead spacer or a spacer obtained by selective etching of an insulating layer (a post spacer) can be used.

As the substrate 315 and the counter substrate 321, a light-transmitting substrate is preferable, for example, a glass substrate of barium borosilicate glass, aluminoborosilicate glass, or the like; a quartz substrate; or a plastic substrate which can withstand a process temperature in a manufacturing process of the liquid crystal display device 200 and the element layer 317 can be used. Further, as the substrate 315 and the counter substrate 321, a glass substrate having any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

A typical example of the switching element formed in the element layer 317 includes a transistor. Although a transistor is described later, the transistor preferably uses a semiconductor, in a channel, which has characteristics needed for operation of a liquid crystal display device in a variety of conditions (e.g., temperature characteristics which allows the device to operate under high temperature and low temperature). Amorphous silicon can be used for a channel region, but as a typical example of a semiconductor with more improved temperature characteristics, microcrystalline silicon having a plurality of crystalline regions, polysilicon, or the like is preferably used. Further, an oxide semiconductor can be used for a channel region, and an In—Ga—Zn—O-based oxide or the like is given as an oxide semiconductor. A transistor including the above-described semiconductor has a small shift in the threshold voltage and high reliability even when the temperature of the transistor becomes increased by heat generation of the backlight module 40 or heat from external light; thus, the transistor operates with high performance even under an environment where the temperature largely changes.

The pixel electrode 319 and the common pixel electrode 323 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide containing silicon oxide.

The light-blocking layer 335 is formed using a light-blocking material that reflects or absorbs light. The light-blocking layer can be formed using, for example, a black organic resin and may be formed by mixing a black resin of a pigment material, carbon black, titanium black, or the like into a resin material such as photosensitive or non-photosensitive polyimide. Alternatively, a light-blocking metal layer can be used, which is made of chromium, molybdenum, nickel, titanium, cobalt, copper, tungsten, or aluminum, for example.

The coloring layer 337 can be formed using a light-transmitting chromatic-color resin layer. As the light-transmitting chromatic-color resin layer, a photosensitive or non-photosensitive organic resin can be given as a typical example. Use of the photosensitive organic resin layer makes it possible to reduce the number of resist masks; thus, the steps are simplified, which is preferable.

Chromatic colors are colors except achromatic colors such as black, gray, or white. The coloring layer is formed of a material which only transmits light colored chromatic color in order to function as the color filter. As chromatic color, red, green, blue, or the like can be used. Alternatively, cyan, magenta, yellow, or the like may also be used. "Transmitting only the chromatic color light" means that light transmitted through the coloring layer has a peak at the wavelength of the chromatic color light.

An optimal thickness of the coloring layer 337 may be adjusted as appropriate in consideration of relation between the concentration of a coloring material included and the transmissivity of light.

The protective layer 339 is formed of a flat insulating layer. As a typical example of the protective layer 339, an acrylic region, an epoxy resin, or the like can be used.

Note that the coloring layer 337 is provided on the counter substrate 321, but a coloring layer may be formed to function as an interlayer insulating layer included in the element layer 317. For example, a light-transmitting chromatic-color resin layer functioning as a color filter layer may be used for an interlayer insulating layer.

In the case where the interlayer insulating layer is formed directly on the element substrate side as a coloring layer, the problem of misalignment between the coloring layer and a pixel region does not occur, whereby the formation region can be controlled more precisely even when a pixel has a minute pattern. In addition, the same insulating layer serves as the interlayer insulating layer and the coloring layer, which brings advantages of process simplification and cost reduction.

The optical modulation action of the liquid crystal 327 is controlled by an electric field (including a horizontal electric field, a vertical electric field, and a diagonal electric field) applied to the liquid crystal 327. Note that the following can be used for the liquid crystal 327 and a driving mode of the liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a ferroelectric liquid crystal, an anti-ferroelectric liquid crystal, a main chain type liquid crystal, a side chain type high-molecular liquid crystal, a plasma address liquid crystal (PALC), a banana-shaped liquid crystal, a TN (Twisted Nematic) mode, an STN (Super Twisted Nematic) mode, an IPS (In-Plane-Switching) mode, an FFS (Fringe Field Switching) mode, an MVA (Multi-domain Vertical Alignment) mode, a PVA (Patterned Vertical Alignment), an ASV (Advanced Super View) mode, an ASM (Axially Symmetric aligned Micro-cell) mode, an OCB (Optical Compensated Birefringence) mode, an ECB (Electrically Controlled Birefringence) mode, an FLC (Ferroelectric Liquid Crystal) mode, an AFLC (Anti Ferroelectric Liquid Crystal) mode, a PDLC (Polymer Dispersed Liquid Crystal) mode, and a guest host mode. Note that this invention is not limited thereto, and various kinds of liquid crystal elements can be used. The alignment of the liquid crystal 327 can be easily performed by rubbing treatment with use of an alignment film.

Alternatively, a blue-phase liquid crystal for which an alignment film is not necessary may be used for the liquid crystal 327. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent so as to improve the temperature range is used for the liquid crystal layer. As for the liquid crystal composition which contains a blue-phase liquid crystal and a chiral material, the response speed is as high as 10 µs to 100 µs, alignment treatment is not necessary and viewing angle dependence is low due to optical isotropy.

The sealant 325 has a function of sealing the liquid crystal 327 between the substrate 315 and the counter substrate 321.

The sealant 325 is preferably a visible-light curing resin, an ultraviolet curing resin, or a thermosetting resin. Typically, an acrylic resin, an epoxy resin, an amine resin, or the like can be used. Further, a photopolymerization initiator (typically, an ultraviolet light polymerization initiator), a thermosetting agent, a filler, or a coupling agent may be included in the sealant.

There is no particular limitation on the second polarizing plate 307 as long as it can make light emitted from the liquid crystal panel 305 polarize. The same plate as the first polarizing plate 303 can be used. In addition, it is preferable to use a polarizing plate which has the optical refractive index as equivalent as possible to that of another component included in the liquid crystal display device 200. The second polarizing plate 307 is provided so that a slit thereof is perpendicular to a slit of the first polarizing plate 303. The second polarizing plate 307 may have a plate shape or a sheet shape (a film-like shape).

In this manner, the liquid crystal display device 200 can be manufactured.

Next, as another embodiment of the liquid crystal display device 200, a liquid crystal display device 300 in which an optical member is provided between the diffusion plate 301 and the first polarizing plate 303 is described. The optical member improves front luminance of light emitted from the backlight module 40 and having uniform brightness at the diffusion plate 301.

Figure 7A:
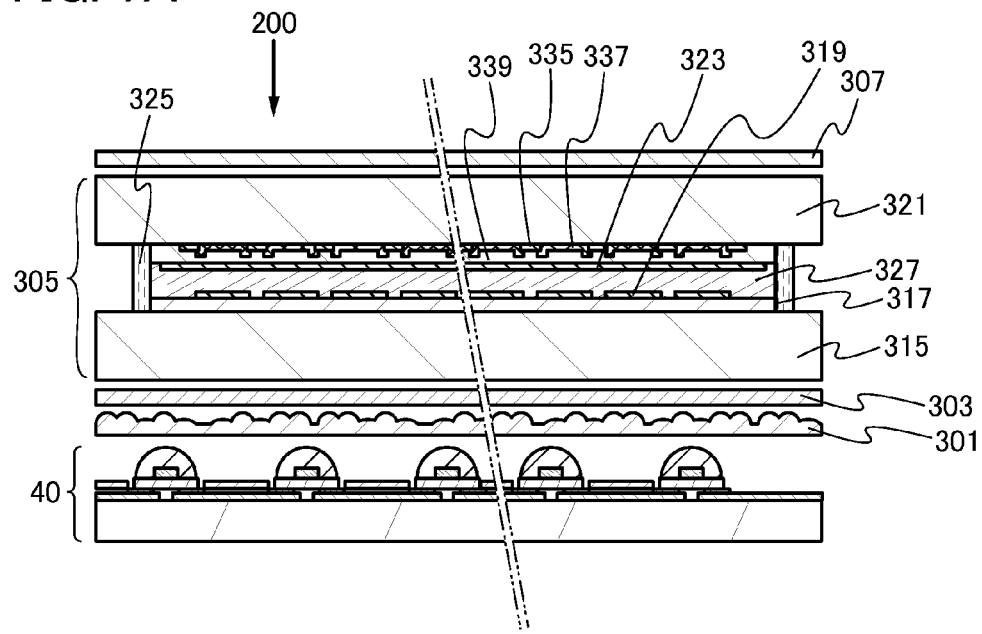
FIGS. 7A and 7B are cross-sectional views each illustrating a display device according to the present invention.
Figure 7B:
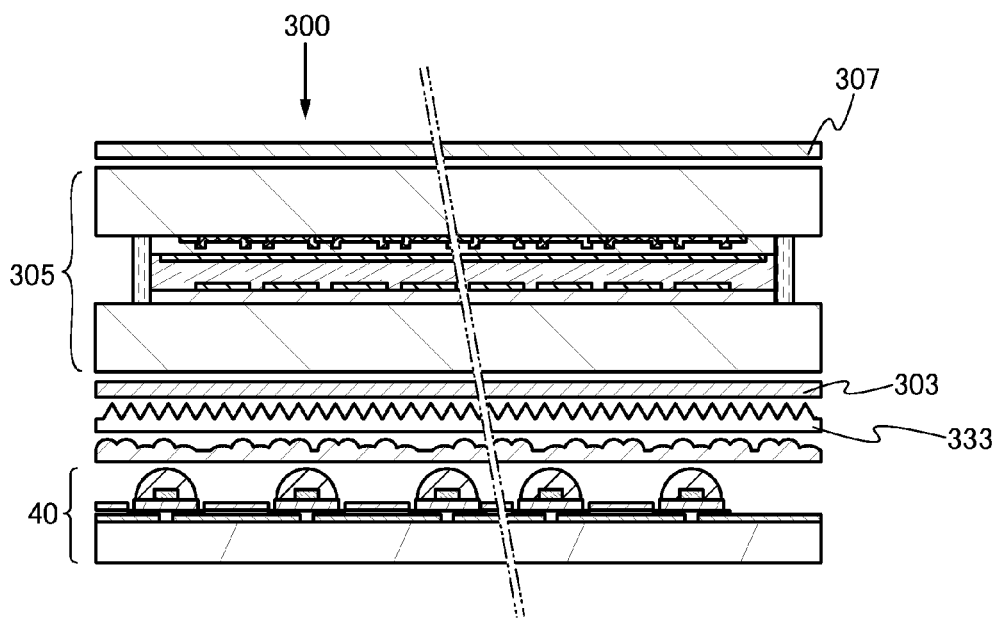

FIG. 7B is a cross-sectional view of the liquid crystal display device 300. As an optical member 333 improving frontal luminance of a pixel portion in the liquid crystal display device, a luminance improving sheet (film) such as a prism sheet or a microlens sheet can be used, which is an optical member that makes light enter the liquid crystal panel 305 as vertically as possible.

The backlight module 40 and the diffusion plate 301 described in the liquid crystal display device 200 of FIG. 7A can be used here as appropriate. The number of luminance improving sheets (films) to be used may be one, but when a plurality of luminance improving sheets (films) are used, frontal luminance of the pixel portion in the liquid crystal display device can be improved. In such a case, the luminance improving sheets (films) may be just arranged so that air is held between the sheets.

Further, as the first polarizing plate 303, the liquid crystal panel 305, and the second polarizing plate 307, those described in the liquid crystal display device 200 can be used as appropriate.

The liquid crystal panel 305 described in the liquid crystal display device 200 is provided to overlap with the backlight module 40 to which the diffusion plate 301 and the optical member 333 are bonded, whereby the liquid crystal display device 300 can be manufactured.

Next, a liquid crystal display device which can uniform brightness of light emitted from the backlight module described in the liquid crystal display devices 200 and 300 is described with reference to FIG. 8.

Figure 8:
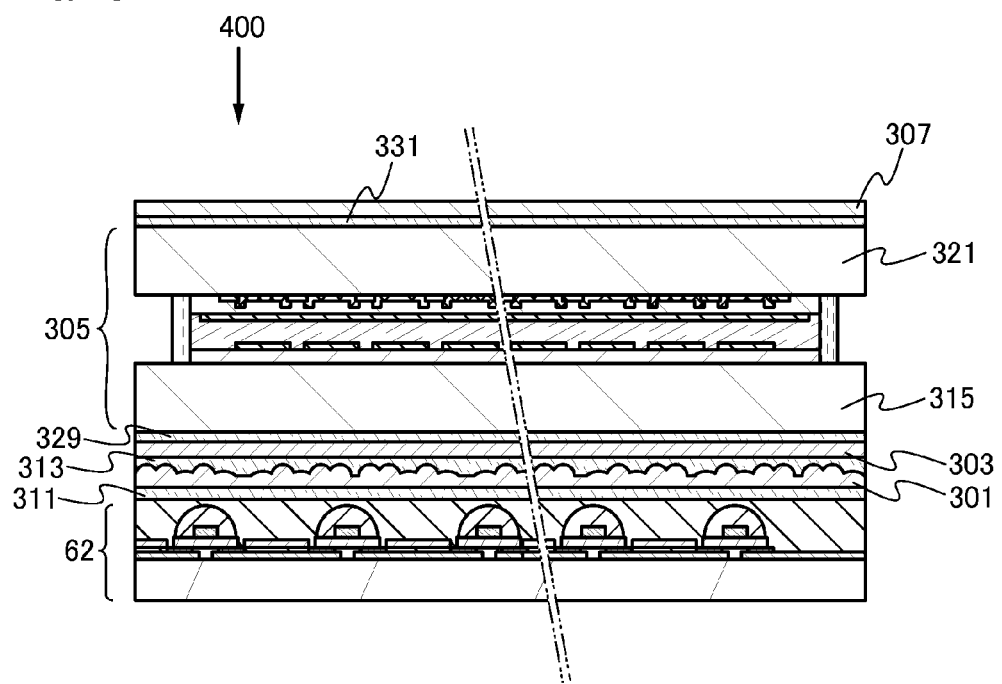
FIG. 8 is a cross-sectional view illustrating a display device according to the present invention.

A liquid crystal display device 400 illustrated in FIG. 8 includes a backlight module 62 which is planarized and has the light-transmitting organic resin layer 63 as illustrated in FIG. 5. Further, the backlight module 62, the diffusion plate 301, the first polarizing plate 303, the liquid crystal panel 305, and the second polarizing plate 307 are bonded to one another with light-transmitting adhesives 311, 313, 329, and 331.

That is, in the liquid crystal display device 400, the backlight module 62, the diffusion plate 301, the first polarizing plate 303, the liquid crystal panel 305, and the second polarizing plate 307 overlap with and are bonded to one another and sealed. The liquid crystal display device 400 in which all components are bonded is not provided with a layer containing air and having smaller refractive index than the diffusion plate 301, the first polarizing plate 303, the liquid crystal panel 305, and the second polarizing plate 307. In the liquid crystal display device 400, differences of optical refractive indices among the above components are small, and light reflection in the liquid crystal display device 400 is suppressed, so that light emitted from the backlight module 62 can be efficiently utilized. As a result, power consumption of the LED unit and display power of the display device can be reduced.

As the light-transmitting adhesives 311, 313, 329, and 331, it is preferable to use an adhesive which has an optical refractive index as equivalent as possible to that of the backlight module 62 and the diffusion plate 301. For example, as the light-transmitting adhesives 311, 313, 329, and 331, an adhesive containing an epoxy resin, an adhesive containing a urethane resin, an adhesive containing a silicone resin, or the like can be used. The adhesives are formed, depending on a selected material, by a droplet discharge method, a coating method, a spin coating method, a dipping method, or the like. Further, the adhesives may be formed with a tool such as a doctor knife, a roll coater, a curtain coater, or a knife coater.

Next, a driving method of an LED unit in the liquid crystal display device which is one embodiment of the present invention is described.

Figure 9A:
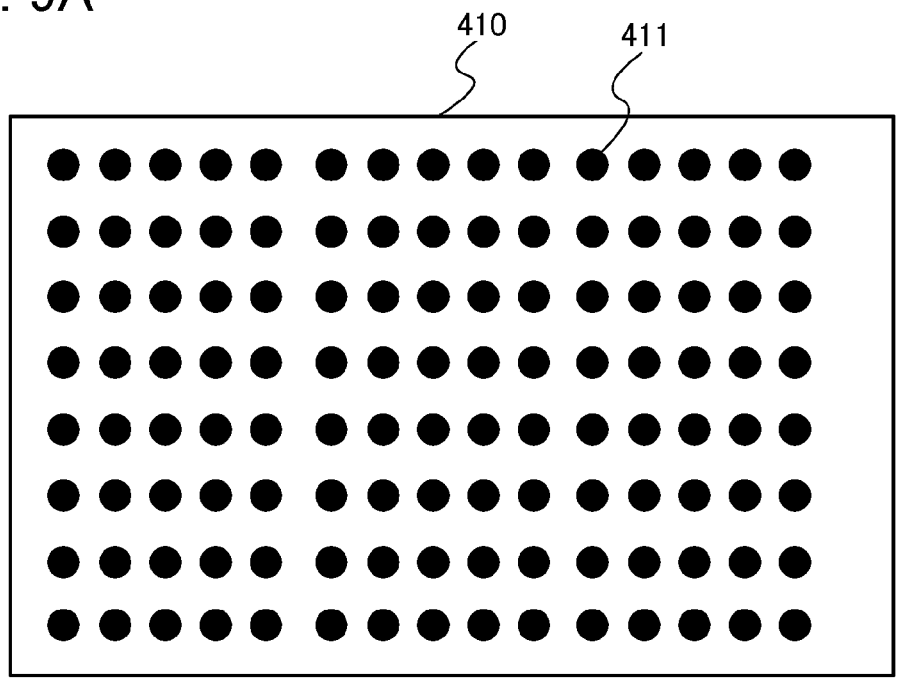
FIGS. 9A and 9B are top views each illustrating a backlight module according to the present invention.
Figure 9B:
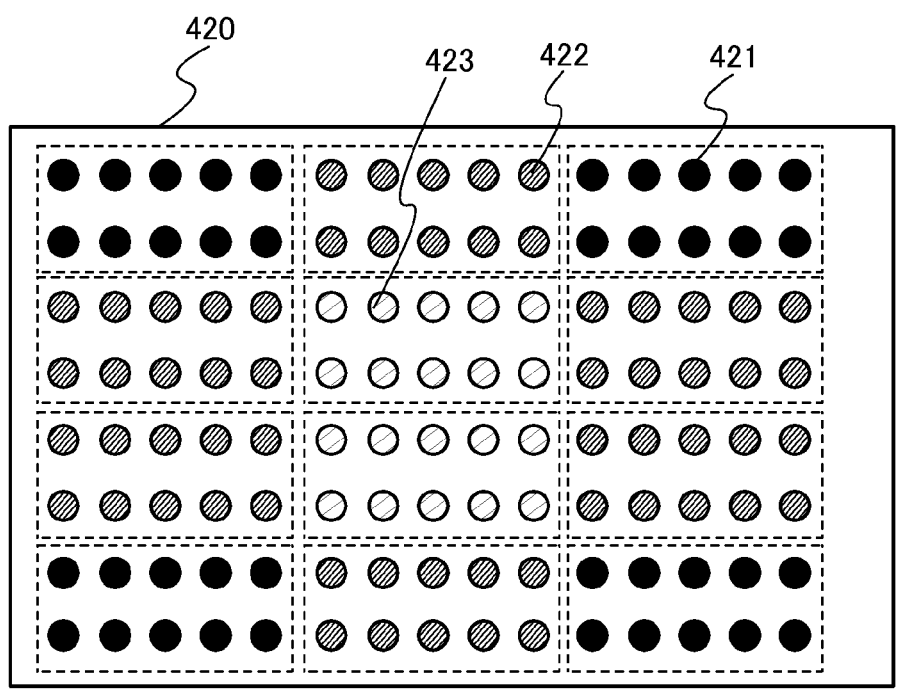

FIGS. 9A and 9B are top views of backlight modules. In the case where an image is displayed by lighting LED units 411 constantly in a backlight module 410 and controlling light transmission or non-transmission with liquid crystals in the liquid crystal panel, a complicated light-emitting element control circuit is not needed, which is a simplified structure (see FIG. 9A).

However, consumed power of the LED unit accounts for a large share of power consumed by the entire liquid crystal display device. That is, it is not preferable in terms of power consumption that the LED units are constantly lit.

As an effective driving method of an LED unit in a direct-below type backlight module which is one embodiment of the present invention, there is a local dimming method in which LED units are divided into a plurality of regions and the LED units themselves have contrast between the regions in accordance with contrast of a displayed image.

A backlight module 420 illustrated in FIG. 9B is in a local diming state. Luminance of LED units 421 and 422 in regions corresponding to dark image portions is decreased, and luminance of LED units 423 in a region corresponding to a bright image portion is increased. By driving the LED units in this way, the contrast ratio of an image is increased, and power consumption of the LED units can be reduced.

Here, details of the liquid crystal panel 305 are described. First, an active-matrix liquid crystal panel is described with reference to FIGS. 10A and 10B.

Figure 10A:
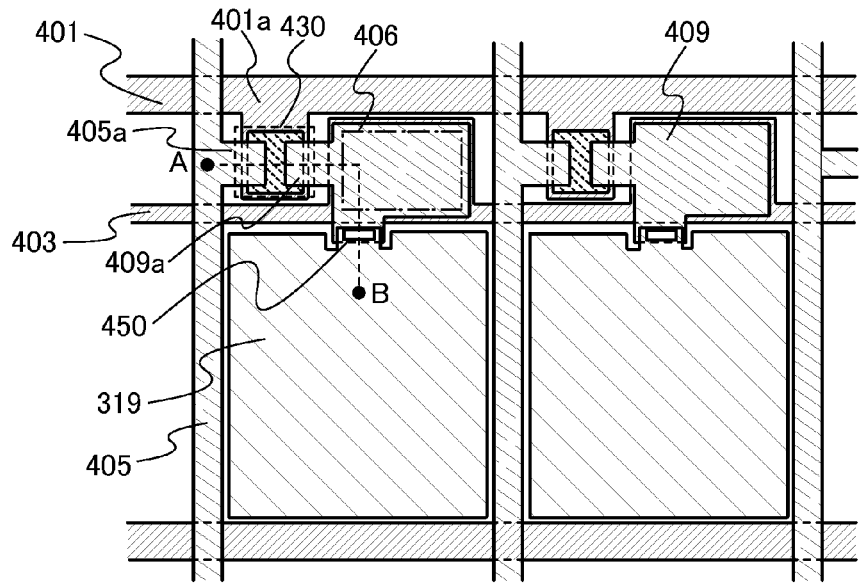
FIGS. 10A and 10B are a top view and a cross-sectional view illustrating a display device according to the present invention.

FIG. 10A is a top view of the liquid crystal panel 305, which illustrates two pixels.

In FIG. 10A, a plurality of signal lines 405 (including a source electrode 405*a*) are arranged in parallel (is extended in the vertical direction in the drawing) to be spaced from each other. A plurality of scan lines 401 (including a gate electrode 401*a*) are provided apart from each other and extended in a direction generally perpendicular to the signal lines 405 (a horizontal direction in the drawing). The plurality of signal lines are connected to the signal line driver circuit 214 (see FIG. 6A), and the plurality of scan lines and capacitor wirings 403 are connected to the scan line driver circuit 211 (see FIG. 6A).

In addition, the capacitor wirings 403 are adjacent to the plurality of scan lines 401 and extended in a direction parallel to the scan lines 401, that is, in a direction generally perpendicular to the signal lines 405 (in the horizontal direction in the drawing). A storage capacitor 406 is surrounded by a dashed-dotted line in FIG. 10A, and includes a gate insulating layer 402 serving as a dielectric, the capacitor wiring 403, and a drain wiring 409 (including a drain electrode 409a). A pixel electrode 319 is electrically connected to the drain wiring 409 through an opening portion 450.

A transistor 430 which controls the potential of the pixel electrode 319 is provided at an upper left corner of the drawing. A plurality of pixel electrodes 319 and a plurality of transistors 430 are arranged in matrix.

Figure 10B:
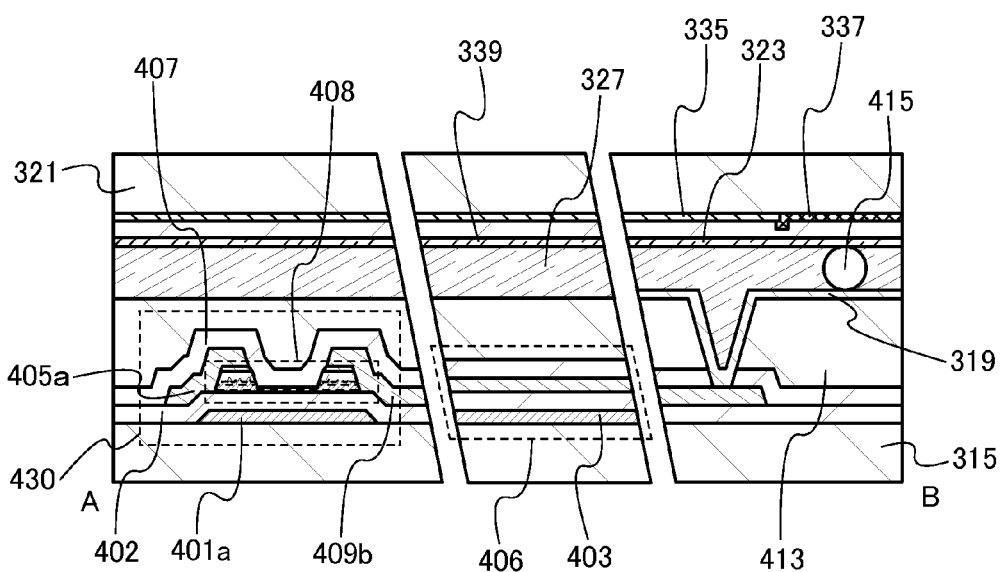

Further, a pixel structure is not limited to that illustrated in FIGS. 10A and 10B, and a capacitor may be formed without providing a capacitor wiring. In such a structure, the pixel electrode overlaps with a scan line of an adjacent pixel with a gate insulating layer and another insulating layer interposed therebetween. In this case, the capacitor wiring can be omitted, whereby the aperture ratio of a pixel can be increased.

FIG. 10B is a cross-sectional view taken along line A-B in FIG. 10A. Divided portions in FIG. 10B correspond to omitted portions between the line A-B in FIG. 10A.

Hereinafter, a structure of the transistor 430 is described. The transistor 430 is an inverted-staggered thin film transistor (TFT) which includes, over the substrate 315 having an insulating surface, a gate electrode 401a, the gate insulating layer 402, a semiconductor layer 408, the source electrode 405a, and the drain electrode 409a. The above components can be formed through the desired deposition steps, the desired photolithography steps, and the desired etching steps.

There is no particular limitation on a structure of a transistor which can be applied to the liquid crystal panel 305. For example, a staggered type or planar type transistor having a top-gate structure or bottom-gate structure can be used. The transistor may have a single-gate structure in which one channel formation region is formed, a double-gate structure in which two channel formation regions are formed, or a triple-gate structure in which three channel formation regions are formed. Alternatively, the transistor may have a dual-gate structure having two gate electrodes, one of which is provided above a channel region with a gate insulating layer interposed therebetween and the other of which is provided below the channel formation region with another gate insulating layer interposed therebetween. The transistor of this embodiment has a single-gate structure.

An insulating layer 407 is provided to cover the transistor 430 and to be in contact with the semiconductor layer 408, and an interlayer insulating layer 413 is stacked thereover.

For the semiconductor layer 408, as described above, it is preferable to use a semiconductor having characteristics needed for operation of the liquid crystal display device even in a variety of conditions (e.g., temperature characteristics which allows the device to operate under high temperature and low temperature). As a typical example of the semiconductor having temperature characteristics, although amorphous silicon can be used, microcrystalline silicon which has a plurality of crystalline regions, or polycrystalline silicon is preferable in order to obtain more excellent temperature characteristics. Alternatively, an oxide semiconductor can be used. Examples of an oxide semiconductor include In—Ga—Zn—O-based oxide and the like. Further, a transistor element including the above-described semiconductor has a small shift in the threshold voltage and high reliability, even when the temperature of the transistor element is increased by heat generation of the backlight module or heat from external light; thus, the transistor element operates with high performance even under an environment where the temperature largely changes.

In the capacitor 406 indicated by a dashed line, the gate insulating layer 402 serving as a dielectric is stacked between the capacitor wiring 403 and the drain electrode 409a as described above. The capacitor wiring 403 is formed from the same layer as the gate electrode 401a under the same condition; thus, it is formed at the time of formation of the gate electrode 401a. Therefore, there is no need for forming the capacitor 406 independently from the transistor 430. The capacitor 406 can be formed by a desired photolithography step through a procedure for forming the transistor 430.

The substrate 315 and the counter substrate 321 are bonded to be fixed with the sealant 325 so that the liquid crystal 327 is interposed therebetween (see FIGS. 7A and 7B). The above-described materials can be used for the sealant 325 and the liquid crystal 327. The liquid crystal 327 can be formed by a dispenser method (a dropping method), or an injection method by which liquid crystal is injected using a capillary phenomenon or the like after the substrate 315 is bonded to the counter substrate 321. In the case where a photocurable resin such as an ultraviolet curable resin is used as the sealant 325 and a liquid crystal layer is formed by a dropping method, the sealant 325 may be cured by the light irradiation step of the polymer stabilization treatment.

In addition, a spacer 415 is provided so that the distance (the cell gap) between the pixel electrode 319 and the common pixel electrode 323 is controlled to be constant. Although a bead spacer is used here, a spacer obtained by selective etching of an insulating layer (a post spacer) may be used. In the liquid crystal display device including the liquid crystal 327, the cell gap is preferably greater than or equal to 1 μm and less than or equal to 20 μm. In this specification, the thickness of a cell gap refers to the length (film thickness) of a thickest part of the liquid crystal.

In addition, a light-blocking layer (a black matrix) is provided in a region overlapping with the semiconductor layer and a contact hole of the transistor 430 or between pixels. Further, a coloring layer is provided in a region corresponding to the pixel electrode.

Next, a passive-matrix liquid crystal panel 305 which can be manufactured more easily than the active-matrix liquid crystal panel 305 in which a switching element (a transistor) is provided in the pixel, is described with reference to FIGS. 11A and 11B. In the passive-matrix liquid crystal panel 305, it is not necessary to provide a switching element (a transistor) in a pixel, which enables the passive-matrix liquid crystal panel 305 to be easily manufactured.

Figure 11A:
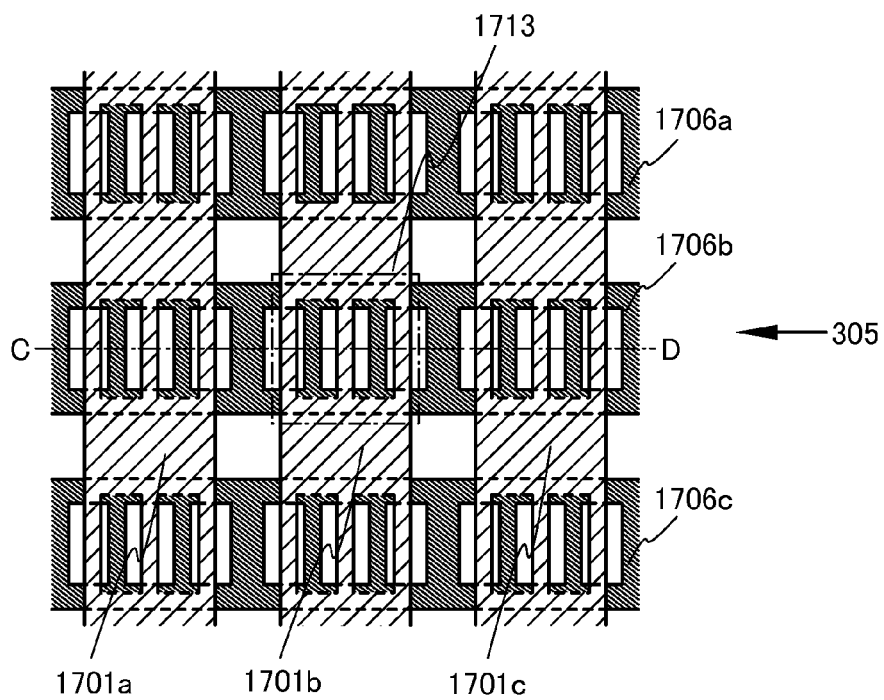
FIGS. 11A and 11B are a top view and a cross-sectional view illustrating a display device according to the present invention.
Figure 11B:
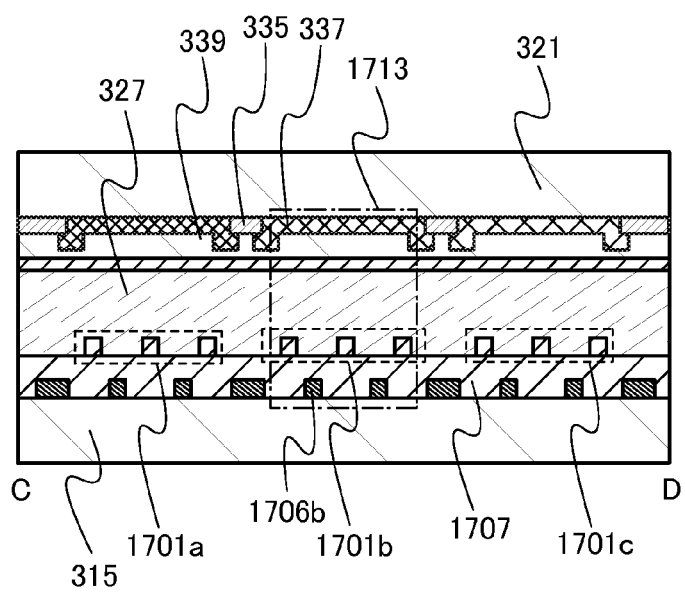

FIG. 11A is a top view of the passive-matrix liquid crystal panel 305. FIG. 11B is a cross-sectional view taken along line C-D in FIG. 11A. The liquid crystal 327, the light-blocking layer 335, the coloring layer 337, the protective layer 339, and the counter substrate 321 are provided as illustrated in FIG. 11B though they are not illustrated in FIG. 11A.

Common electrodes 1706a, 1706b, and 1706c, an insulating layer 1707, and pixel electrodes 1701a, 1701b, and 1701c are provided between the counter substrate 321 and the substrate 315. The pixel electrodes 1701a, 1701b, and 1701c correspond to the pixel electrode 319 for active matrix type (see FIGS. 7A and 7B), and the common electrodes 1706a, 1706b, and 1706c correspond to the common electrode 323 for active matrix type (see FIGS. 7A and 7B). Further, the pixel electrodes 1701a, 1701b, and 1701c are controlled by a common driver corresponding to a scan line driver circuit for active matrix type, and the common electrodes 1706a, 1706b, and 1706c are controlled by a segment driver corresponding to a signal line driver circuit for active matrix type.

The pixel electrodes 1701a, 1701b, and 1701c and the common electrodes 1706a, 1706b, and 1706c each have a shape with an opening pattern which includes a rectangular opening (slit) in a pixel region of a liquid crystal element.

With an electric field formed between the pixel electrodes 1701a, 1701b, and 1701c and the common electrodes 1706a, 1706b, and 1706c, the liquid crystal 327 is controlled. An electric field in a lateral direction is formed for the liquid crystal, so that liquid crystal molecules can be controlled using the electric field. The liquid crystal molecules can be controlled in the direction parallel to the substrate, whereby a wide viewing angle is obtained.

The counter substrate 321 is provided with the light-blocking layer 335, the coloring layer 337, and the protective layer 339.

Although not illustrated, the spacer can be used for keeping the cell gap, and the above-described sealant can be used for sealing the liquid crystal 327 in the same manner as the liquid crystal display device of the active matrix type.

Note that this embodiment can be implemented in free combination with any of the other embodiments.

Embodiment 3

In this embodiment, a display device which controls the amount of light, in each pixel, transmitted from a backlight with use of micro electro mechanical systems (MEMS) will be described with reference to FIG. 12, FIG. 13, and FIG. 14.

Figure 12:
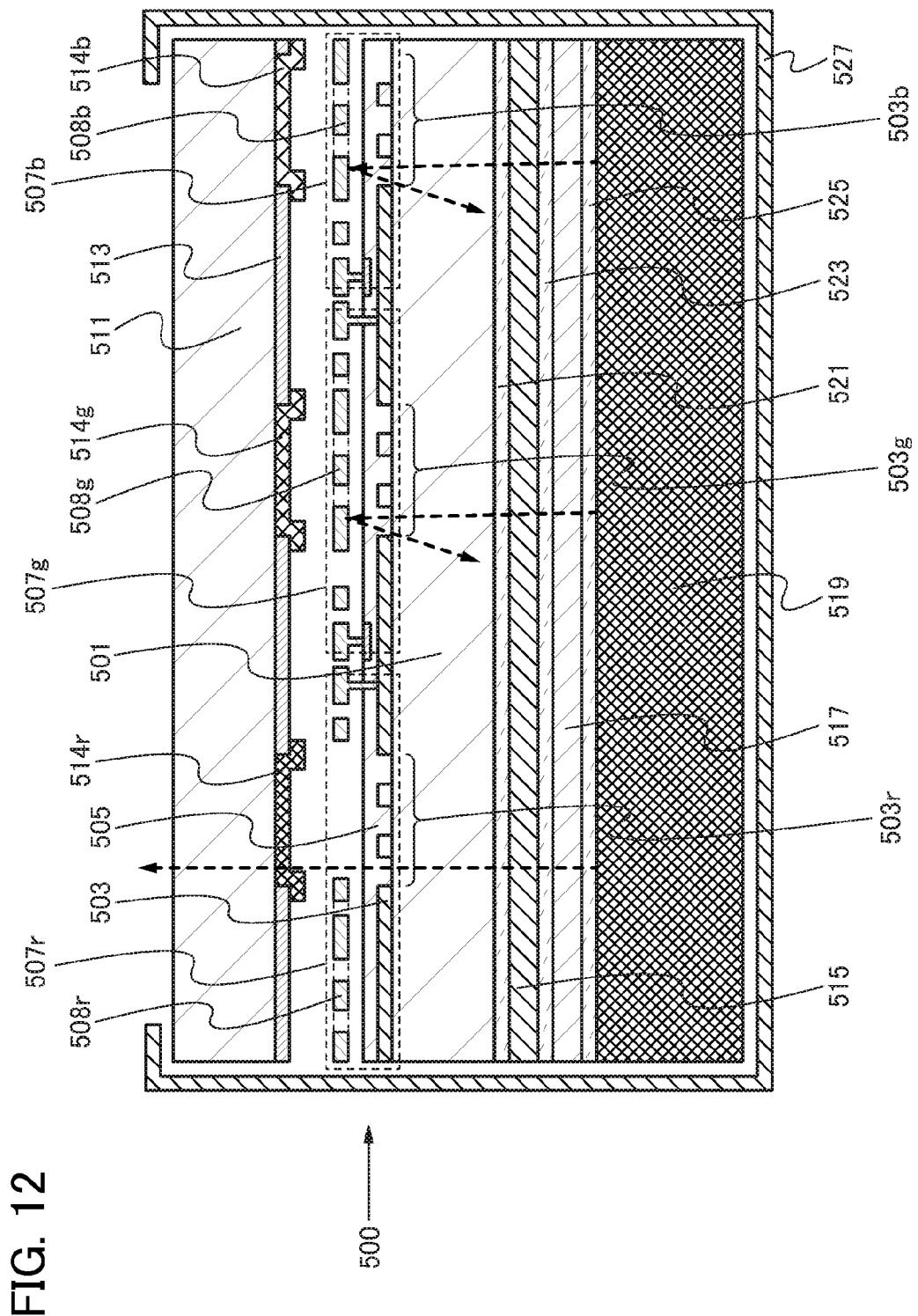
FIG. 12 is a cross-sectional view illustrating a display device according to the present invention.

FIG. 12 is a cross-sectional view of a display device 500 which controls the amount of light, in each pixel, transmitted from a backlight with use of MEMS having a three-dimensional structure and a microstructure part of which can be moved.

A reflective layer 503 is formed over a first substrate 501. A light-transmitting insulating layer 505 is provided over the reflective layer 503. MEMS switches 507r, 507g, and 507b are formed over the light-transmitting insulating layer 505. Note that although not illustrated, the light-transmitting insulating layer 505 includes a plurality of insulating layers, and transistors connected to the MEMS switches 507r, 507g, and 507b are formed between the insulating layers. As the transistors, the transistor described in Embodiment 2 can be used as appropriate. On a second substrate 511 facing the first substrate 501, a light-blocking layer 513 is formed in a portion facing the reflective layer 503, and coloring layers 514r, 514g, and 514b are formed in portions facing opening portions 503r, 503g, and 503b surrounded by the reflective layer 503. Note that the coloring layer 514r transmits red light, the coloring layer 514g transmits green light, and the coloring layer 514b transmits blue light.

Further, a diffusion plate 515, a luminance improvement sheet 517, and a backlight 519 are provided on the first substrate 501 side in this order. The first substrate 501 and the diffusion plate 515, the diffusion plate 515 and the luminance improvement sheet 517, and the luminance improvement sheet 517 and the backlight 519 are bonded with light-transmitting adhesives 521, 523, and 525.

A chassis 527 formed using a metal sheet or molded plastic is provided to be extended from the second substrate 511 side so as to cover the backlight 519.

In the display device 500 described in this embodiment, for example, the opening portions 503g and 503b surrounded by the reflective layer 503 are covered by a non-opening portion in a shutter 508g of the MEMS switch 507g and a non-opening portion in a shutter 508b of the MEMS switch 507b, whereby light from the backlight 519 is reflected at the non-opening portions in the shutters 508g and 508b and is not transmitted. A shutter 508r of the MEMS switch 507r does not cover the opening portion 503r surrounded by the reflective layer 503 but moves to an upper portion of the reflective layer 503. Therefore, light from the backlight 519 passes through the opening portion 503r, and light of a color of a coloring layer (in this case, red) is emitted.

Further, luminance of each pixel or gradation can be controlled with the number of opening and closing times of the MEMS switch 507 or the duty ratio.

As the first substrate 501 and the second substrate 511, substrates similar to those of the liquid crystal display device described in Embodiment 2 can be used as appropriate.

The reflective layer 503 is formed using aluminum, silver, molybdenum, tungsten, nickel, chromium, an alloy containing any of these, an AgPdCu alloy, or the like. The thickness of the reflective layer 503 is greater than or equal to 30 nm and less than or equal to 1000 nm. The opening portion may have a rectangular shape, a circular shape, an elliptical shape, a polygonal shape, or the like. Through the opening portions 503r, 503g, and 503b, light emitted from the backlight 519 is transmitted to the outside of the display device. Note that light which is emitted from the backlight 519 and does not pass through the opening portion is reflected at the reflective layer 503 and reflected again at a backlight module, so that the reflected light can be reused.

The reflective layer 503 can be formed as follows: a film is formed by a sputtering method, an evaporation method, or the like; and the film is partly etched by a photolithography step. Alternatively, the reflective layer 503 can be formed by a printing method, an inkjet method, or the like.

The light-transmitting insulating layer 505 is formed using silicon oxide, silicon nitride, silicon oxynitride, silicon nitride oxide, or the like by a sputtering method, a CVD method, an evaporation method, or the like.

The MEMS switches 507r, 507g, and 507b have the same structure. Here, with use of the MEMS switch 507r as a typical example, the structure of the MEMS switch is described with reference to FIG. 12 and FIG. 13.

Figure 13:
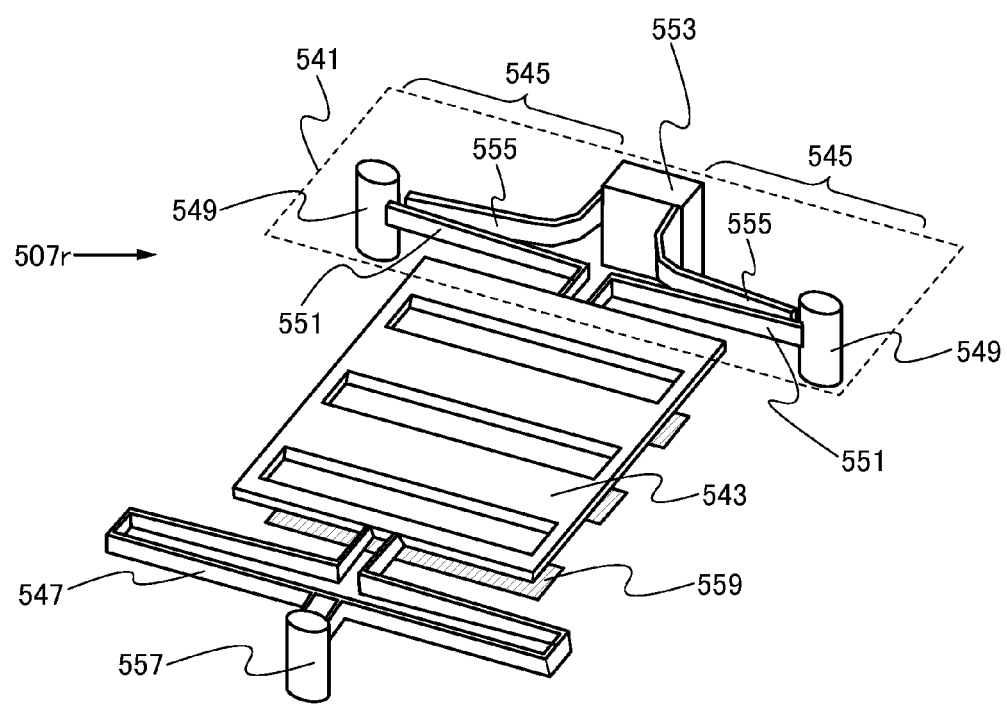
FIG. 13 is a perspective view illustrating a MEMS switch of a display device according to the present invention.

FIG. 13 is a perspective view of the MEMS switch 507r. The MEMS switch 507r includes a shutter 543 connected to an actuator 541. The shutter 543 has opening portions. The actuator 541 has two flexible actuators 545. One of sides of the shutter 543 is connected to the actuators 545. The actuators 545 have a function of moving the shutter 543 in the lateral direction which is a direction parallel to a surface of the insulating layer 505.

Each actuator 545 includes a movable electrode 551 connected to the shutter 543 and a structure body 549 and a movable electrode 555 connected to a structure body 553. The movable electrode 555 is adjacent to the movable electrode 551, and one end of the movable electrode 555 is connected to the structure body 553, and the other end can be freely moved. The end portion of the movable electrode 555, which can be freely moved, is bent so as to be closest to the connection portion of the movable electrode 551 and the structure body 549.

The other side of the shutter 543 is connected to a spring 547 which has restoring force opposing force applied by the actuator 541. The spring 547 is connected to a structure body 557.

The structure bodies 549, 553, and 557 function as mechanical supports which lifts the shutter 543, the actuators 545, and the spring 547 in the vicinity of the surface of the insulating layer 505.

An opening portion 559 surrounded by the reflective layer is provided below the shutter 543. The opening portion 559 corresponds to the opening portion 503r in FIG. 12.

The structure body 553 included in the MEMS switch 507r is connected to the transistor which is not illustrated. Thus, a given voltage can be applied to the movable electrode 555 connected to the structure body 553 through the transistor. The structure bodies 549 and 557 are each connected to a ground electrode (GND) with the reflective layer 503 illustrated in FIG. 12. Therefore, a potential of the movable electrode 551 connected to the structure body 549 and a potential of the spring 547 connected to the structure body 557 are GND. Note that the structure bodies 549 and 557 may be electrically connected to a common electrode to which a given voltage can be applied.

When the voltage is applied to the movable electrode 555, the movable electrode 551 and the movable electrode 555 are electrically drawn to each other due to a potential difference between the movable electrode 555 and the movable electrode 551. As a result, the shutter 543 connected to the movable electrode 551 is drawn toward the structure body 553 and moves to the structure body 553 in the lateral direction. Since the movable electrode 551 has a function of a spring, when the voltage between the potential of the movable electrode 551 and the potential of the movable electrode 555 is removed, the movable electrode 551 releases the stress stored in the movable electrode 551 and pushes the shutter 543 back to the original position.

The manufacturing method of the MEMS switch 507r is described below. A sacrificial layer with a predetermined shape is formed by a photolithography step over the insulating layer 505. The sacrificial layer can be formed using an organic resin such as polyimide or acrylic, an inorganic insulating layer such as a silicon oxide layer, a silicon nitride layer, a silicon oxynitride layer, or a silicon nitride oxide layer, or the like.

Next, a conductive layer is formed over the sacrificial layer by a printing method, a sputtering method, an evaporation method, or the like, and then, is selectively etched, so that the MEMS switch 507 is formed. Alternatively, the MEMS switch 507 is formed by an inkjet method.

Next, the sacrificial layer is removed, whereby the MEMS switch 507r which can be moved in a space can be formed. After that, the surface of the MEMS switch 507r is preferably oxidized by oxygen plasma, thermal oxidation treatment, or the like, so that an oxide film is formed. Alternatively, an insulating film including alumina, silicon oxide, silicon nitride, silicon oxynitride, silicon nitride oxide, DLC (diamond-like carbon), or the like is preferably formed on the surface of the MEMS switch 507r by an atomic layer deposition method or a CVD method. By providing the insulating film for the MEMS switch 507, deterioration in characteristics of the MEMS switch 507 over time can be reduced.

The MEMS switch 507r can be formed using metal such as aluminum, copper, nickel, chromium, titanium, molybdenum, tantalum, or neodymium or an alloy containing any of these. The MEMS switch 507 is formed to have a thickness greater than or equal to 100 nm and less than or equal to 5 μm.

The light-blocking layer 513 provided for the second substrate 511 is provided to cover the reflective layer 503.

The coloring layers 514r, 514g, and 514b provided for the second substrate 511 can be formed in a manner similar to that of the coloring layer 337 described in Embodiment 2. Note that as the coloring layer, a coloring layer which transmits another color can be provided as appropriate.

Note that although not illustrated, the first substrate 501 and the second substrate 511 are fixed with a sealant to hold a certain space therebetween.

As the diffusion plate 515 and the luminance improvement sheet 517 illustrated in FIG. 12, the diffusion plate 301 and the luminance improvement sheet described in Embodiment 2 can be used as appropriate.

As the backlight 519, the backlight described in Embodiment 1 can be used.

With use of the backlight described in Embodiment 1, the color purity of light emitted from the second substrate 511 is increased. Therefore, color reproducibility of the display device can be increased. Since the display device including the MEMS switch has high use efficiency of light which is emitted from the backlight 519, high contrast can be sufficiently obtained even when luminance of the backlight is decreased; thus, power consumption of the display device can be reduced.

Next, a circuit diagram and an operation method of the display device described in this embodiment are described with reference to FIG. 13 and FIG. 14.

Figure 14:
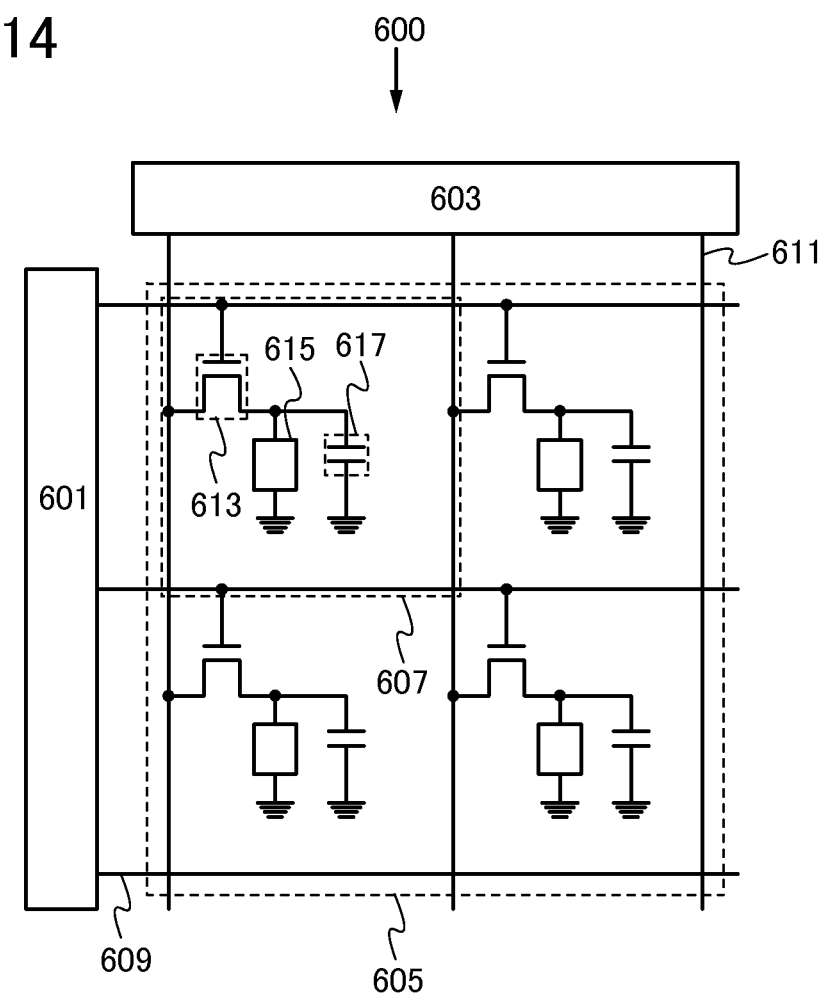
FIG. 14 is a circuit diagram illustrating a display device according to the present invention.

FIG. 14 is a circuit diagram of a display device described in this embodiment. A display device 600 includes a scan line driver circuit 601, a signal line driver circuit 603, and a pixel portion 605. The pixel portion 605 is provided with scan lines 609 connected to the scan line driver circuit 601 and signal lines 611 connected to the signal line driver circuit 603. In the pixel portion 605, pixels 607 are arranged in matrix. The scan line driver circuit 601 is a circuit which makes the pixels 607 drive and has a function of outputting a plurality of display selection signals that are pulse signals. Further, the signal line driver circuit 603 has a function of generating a data voltage Vd in accordance with an inputted image signal and applying the generated data voltage Vd to the signal lines 611. Each pixel 607 is provided with a transistor 613 in which a gate is connected to the scan line 609 and a first electrode is connected to the signal line 611, a MEMS switch 615 in which a first terminal is connected to a second electrode of the transistor 613, and a capacitor 617 in which a first electrode is connected to the second electrode of the transistor 613 and the first terminal of the MEMS switch 615. A second terminal of the MEMS switch 615 and a second electrode of the capacitor 617 are connected to a ground electrode.

The transistor 613 controls the voltage applied to the MEMS switch 615. The transistor described in Embodiment 2 can be used for the transistor 613. Instead of the transistor, a diode or a metal insulator metal (MIM) may be used.

The MEMS switch 615 corresponds to the MEMS switch 507r illustrated in FIG. 13.

The MEMS switch 615 includes an actuator having two movable electrodes and a shutter. The two movable electrodes have capacitance different from each other.

The transistor 613 is connected to the movable electrode 555 having lower capacitance with the structure body 553 in the MEMS switch 615. The movable electrode 551 in the MEMS switch 507 is connected to the shutter 543 with a large area and thus has high capacitance and is connected to a common electrode or a ground electrode with the structure body 549. The spring 547 is connected to the common electrode or the ground electrode with the structure body 557.

A writing voltage Vwe is sequentially applied to the scan lines 609, so that the transistors 613 are turned on in sequence. The data voltage Vd is applied to the selected signal line 611. The data voltage Vd is written to the MEMS switch 615 and the capacitor 617 which are connected to the transistor 613 that is on. Thus, a potential difference is generated between the movable electrode 555 and the shutter 543. Due to generation of the potential difference, the shutter is electrically drawn toward the movable electrode 555, moves, and does not overlap with an opening portion of the pixel portion; thus, light from the backlight passes through the opening portion.

In a display device of an analog driving method, the data voltage Vd is applied to the signal lines 611 in accordance with desired luminance of the pixels 607. The moving distance of the shutter in the MEMS switch 615 depends on the data voltage Vd. In accordance with the moving distance of the shutter, an area where the opening portion of the pixel portion overlaps with the opening portion of the shutter varies or the opening portion of the pixel portion does not overlap with the opening portion of the shutter; thus, the amount of light, which passes through the opening portion, from the backlight varies.

In the display device of a digital driving method, as the data voltage Vd, a voltage that is lower than the voltage at which the actuator of the MEMS switch 615 operates (the operation threshold voltage) or higher than the operation threshold voltage is applied. With application of the data voltage Vd that is higher than the operation threshold voltage, the shutter of the MEMS switch 615 moves, and light from the backlight is transmitted through the opening portion of the pixel portion.

The voltage applied to the signal line 611 is held in the capacitor 617 of the pixel 607 even after the application of the wiring voltage Vwe is stopped. The voltage of the capacitor 617 is substantially stored until the whole video frame has been written or new data is written to the signal line 611. Thus, the number of times of writing can be minimized, and power consumption of the display device can be reduced.

Note that in this embodiment, the circuit diagram in which one transistor is connected to the MEMS switch 615 is illustrated, but the circuit configuration is not limited to this, and transistors can be provided as appropriate.

The display device including the MEMS switch has high use efficiency of light emitted from the backlight; thus, sufficiently high contrast can be obtained even when luminance of the backlight is decreased. As a result, power consumption of the display device can be reduced.

Embodiment 4

A display device of one embodiment of the present invention can be applied to a variety of electronic devices. Examples of electronic devices include a television device (also referred to as a TV or a television receiver). In addition, a display device of one embodiment of the present invention can be applied to indoor digital signage, public information display (PID), advertisements in vehicles such as a train, or the like. In particular, since the display device of one embodiment of the present invention can improve color purity, the use of the display device as the above electronic devices is effective in obtaining color reproducibility. Examples of electronic devices in which the display device of one embodiment of the present invention is used are illustrated in FIGS. 15A and 15B.

Figure 15A:
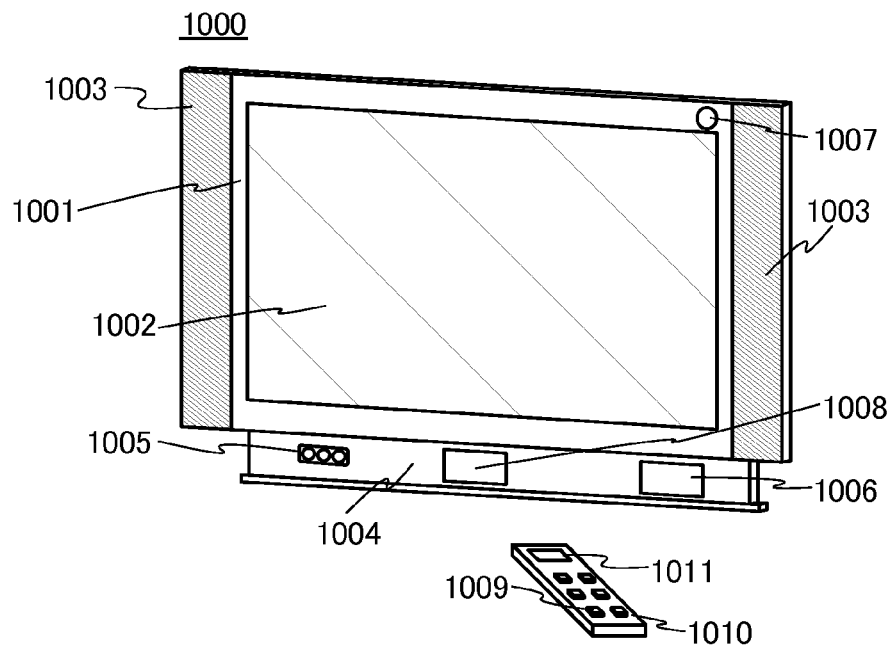
FIGS. 15A and 15B illustrate an example of a television device and an example of digital signage, respectively.
Figure 15B:
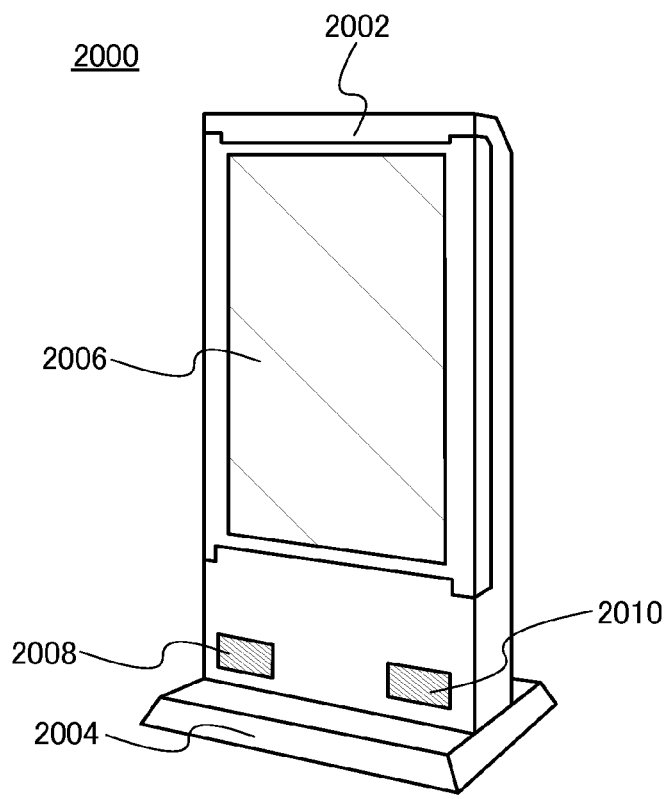

FIG. 15A illustrates an example of a television device. In a television device 1000, a display portion 1002 is incorporated in a housing 1001. Images can be displayed on the display portion 1002. Here, the housing 1001 is supported by a housing 1004. In addition, the television device 1000 is provided with a speaker 1003, operation keys 1005 (including a power switch or an operation switch), a connection terminal 1006, a sensor 1007 (having a function of measuring force, displacement, position, speed, distance, light, temperature, sound, time, electric field, current, voltage, electric power, or infrared ray), a microphone 1008, and the like.

The television device 1000 can be operated with the operation switch or a separate remote controller 1010. With operation keys 1009 provided in the remote controller 1010, channels or volume can be controlled, whereby an image displayed on the display portion 1002 can be controlled. The remote controller 1010 may include a display portion 1011 for displaying data output from the remote controller 1010.

Note that the television device 1000 is provided with a receiver, a modem, and the like. A general television broadcast can be received with the receiver. Moreover, when the display device is connected to a communication network with or without wires via the modem, one-way (from a sender to a receiver) or two-way (between a sender and a receiver or between receivers) information communication can be performed.

FIG. 15B illustrates an example of digital signage. For example, digital signage 2000 includes two housings, a housing 2002 and a housing 2004. The housing 2002 includes a display portion 2006 and two speakers, a speaker 2008 and a speaker 2010. In addition, the digital signage 2000 may be provided with a sensor so as to operate in a following manner: an image is not displayed when a person is not close to the digital signage or the like.

The display device of one embodiment of the present invention can be used for the display portion 1002 in the television device 1000 and the display portion 2006 in the digital signage 2000 and has an advantage of improving color purity. Thus, color reproducibility of the television device 1000 and the digital signage 2000 can be increased.

Note that this embodiment can be implemented in free combination with any of the other embodiments.

This application is based on Japanese Patent Application serial no. 2010-238723 filed with Japan Patent Office on Oct. 25, 2010, the entire contents of which are hereby incorporated by reference.

What is claimed is:

1. A light-emitting element unit comprising:
a board;
a light-emitting element chip provided over the board;
a micro optical resonator provided at a periphery of the light-emitting element chip; and
a phosphor layer covering at least the light-emitting element chip,
wherein the phosphor layer is provided between the light-emitting element chip and the micro optical resonator, and
wherein the micro optical resonator comprises a reflective layer, a semi-transmissive semi-reflective layer facing the reflective layer and a light-transmitting layer sandwiched therebetween.

2. The light-emitting element unit according to claim 1, wherein the semi-transmissive semi-reflective layer covers a top surface and a side surface of the light-transmitting layer.

3. The light-emitting element unit according to claim 2, wherein a light path length L between the reflective layer and the semi-transmissive semi-reflective layer is represented by a formula, $L=(2m+1)\lambda/4n$, and
wherein the m indicates an integer, the $\lambda$ indicates a wavelength, and the n indicates a refractive index of the light-transmitting layer.

4. The light-emitting element unit according to claim 3, wherein the $\lambda$ is 430 nm to 490 nm.

5. The light-emitting element unit according to claim 3, wherein the $\lambda$ is 490 nm to 550 nm.

6. The light-emitting element unit according to claim 3, wherein the $\lambda$ is 550 nm to 590 nm.

7. The light-emitting element unit according to claim 3, wherein the $\lambda$ is 640 nm to 770 nm.

8. The light-emitting element unit according to claim 2, wherein the light-transmitting layer comprises a plurality of layers which are stacked.

9. The light-emitting element unit according to claim 1, wherein the phosphor layer covers the micro optical resonator.

10. The light-emitting element unit according to claim 1, further comprising an organic resin layer covering the phosphor layer, wherein the organic resin layer transmits a light, and wherein a shape of the organic resin layer is a convex shape.

11. The light-emitting element unit according to claim 1, wherein the micro optical resonator does not overlap with the light-emitting element chip.

12. A display device comprising:
a substrate;
a module including a light-emitting element unit provided over the substrate;
a diffusion plate overlapping with the module;
a first polarizing plate overlapping with the diffusion plate;
a liquid crystal panel overlapping with the first polarizing plate; and
a second polarizing plate overlapping with the liquid crystal panel,
the light-emitting element unit comprising:
a board;
a light-emitting element chip provided over the board;
a micro optical resonator provided at a periphery of the light-emitting element chip; and
a phosphor layer covering at least the light-emitting element chip,
wherein the phosphor layer is provided between the light-emitting element chip and the micro optical resonator,
wherein the micro optical resonator comprises a reflective layer, a semi-transmissive semi-reflective layer facing the reflective layer and a light-transmitting layer sandwiched therebetween, and
wherein the liquid crystal panel includes a coloring layer.

13. The display device according to claim 12, wherein an optical member is provided between the diffusion plate and the first polarizing plate.

14. The display device according to claim 12, wherein the semi-transmissive semi-reflective layer covers a top surface and a side surface of the light-transmitting layer.

15. The display device according to claim 14, wherein a light path length L between the reflective layer and the semi-transmissive semi-reflective layer is represented by a formula, $L=(2m+1)\lambda/4n$, and
wherein the m indicates an integer, the $\lambda$ indicates a wavelength, and the n indicates a refractive index of the light-transmitting layer.

16. The display device according to claim 15, wherein the $\lambda$ is 430 nm to 490 nm.

17. The display device according to claim 15, wherein the $\lambda$ is 490 nm to 550 nm.

18. The display device according to claim 15, wherein the $\lambda$ is 550 nm to 590 nm.

19. The display device according to claim 15, wherein the $\lambda$ is 640 nm to 770 nm.

20. The display device according to claim 14, wherein the light-transmitting layer comprises a plurality of layers which are stacked.

21. The display device according to claim 12, wherein the phosphor layer covers the micro optical resonator.

22. The display device according to claim 12, further comprising an organic resin layer covering the phosphor layer, wherein the organic resin layer transmits a light, and wherein a shape of the organic resin layer is a convex shape.

23. The display device according to claim 12, wherein the micro optical resonator does not overlap with the light-emitting element chip.

* * * * *